(12) United States Patent
Cho et al.

(10) Patent No.: US 7,977,144 B2
(45) Date of Patent: Jul. 12, 2011

(54) THIN FILM TRANSISTOR ARRAY PANEL AND MANUFACTURE THEREOF

(75) Inventors: Seung-Hwan Cho, Hwaseong-si (KR); Bo-Sung Kim, Seoul (KR); Keun-Kyu Song, Yongin-si (KR); Tae-Young Choi, Seoul (KR); Jung-Hun Noh, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/772,845

(22) Filed: May 3, 2010

(65) Prior Publication Data

US 2010/0216267 A1 Aug. 26, 2010

Related U.S. Application Data

(62) Division of application No. 11/927,377, filed on Oct. 29, 2007, now Pat. No. 7,737,448.

(30) Foreign Application Priority Data

Mar. 30, 2007 (KR) .................. 10-2007-0031350

(51) Int. Cl.
 *H01L 21/00* (2006.01)

(52) U.S. Cl. .......... 438/72; 438/149; 438/151; 438/158; 438/166; 257/40; 257/53; 257/59; 257/67; 257/79; 257/E21.414

(58) Field of Classification Search .................. None
See application file for complete search history.

(56) References Cited

U.S. PATENT DOCUMENTS

| 6,593,977 | B2 * | 7/2003 | Ishihara et al. | 349/43 |
| 2003/0173890 | A1 * | 9/2003 | Yamazaki et al. | 313/498 |
| 2004/0104461 | A1 | 6/2004 | Ishihara et al. | |
| 2004/0183977 | A1 | 9/2004 | Kitagawa et al. | |
| 2005/0078259 | A1 | 4/2005 | Ahn et al. | |
| 2005/0270450 | A1 * | 12/2005 | Ahn et al. | 349/114 |
| 2006/0108581 | A1 * | 5/2006 | Ahn et al. | 257/40 |
| 2006/0202199 | A1 | 9/2006 | Kim et al. | |

FOREIGN PATENT DOCUMENTS

| JP | 2002-244590 | 8/2002 |
| JP | 2002-352955 | 12/2002 |
| JP | 2002-370352 | 12/2002 |
| JP | 2004-247704 | 9/2004 |
| JP | 2006-086128 | 3/2006 |
| JP | 2006-245526 | 9/2006 |
| JP | 2006-319229 | 11/2006 |
| KR | 10/2005-0051550 | 6/2005 |
| KR | 10-2005-0059154 | 6/2005 |
| KR | 2005-326799 | 11/2005 |

(Continued)

*Primary Examiner* — N Drew Richards
*Assistant Examiner* — Kyoung Lee
(74) *Attorney, Agent, or Firm* — Innovation Counsel LLP

(57) ABSTRACT

A method for a thin film transistor array panel includes forming a gate line and a pixel electrode on a substrate, forming a gate insulating layer covering the gate line, forming a data line including a source electrode and a drain electrode on the gate insulating layer, forming an interlayer insulating layer covering the data line and the drain electrode on the gate insulating layer, forming a first opening in the interlayer insulating layer, forming an organic semiconductor in the first opening, forming a passivation layer on the organic semiconductor and the interlayer insulating layer, and forming a second opening in the interlayer insulating layer to expose the pixel electrode.

13 Claims, 27 Drawing Sheets

FOREIGN PATENT DOCUMENTS

| KR | 10-2006-003481 | 4/2006 |
| KR | 10-20060061912 | 6/2006 |
| KR | 10-2006-0078007 | 7/2006 |
| KR | 10-2006-0049189 | 11/2006 |
| KR | 10-2006-0118340 | 11/2006 |
| KR | 10-2006-0125453 | 12/2006 |

* cited by examiner

THIN FILM TRANSISTOR ARRAY PANEL AND MANUFACTURE THEREOF

CROSS-REFERENCE TO RELATED APPLICATION

This application is a divisional of U.S. patent application Ser. No. 11/927,377 filed on Oct. 29, 2007, which claims priority to and the benefit of Korean Patent Application No. 10-2007-0031350 filed in the Korean Intellectual Property Office on Mar. 30, 2007, the entire contents of which are incorporated herein by reference.

BACKGROUND OF THE INVENTION

1. Field of the Invention

The present invention relates to a thin film transistor array panel and a manufacturing method therefor.

2. Description of the Related Art

Generally, a flat panel display such as a liquid crystal display (LCD), an organic light emitting diode (OLED) display, and an electrophoretic display includes a pair of electric-field generating electrodes and an electro-optical active layer disposed therebetween. The LCD includes a liquid crystal layer as the electro-optical active layer, and the OLED display includes an organic light emitting layer as the electro-optical active layer.

One of the pair of field generating electrodes is usually coupled with a switching element to receive electrical signals, and the electro-optical active layer converts the electrical signals into optical signals to display images. The switching element for the flat panel display includes a thin film transistor (TFT) having three terminals Gate lines transmit signals for controlling the TFTs and data lines transmit data signals to the pixel electrodes through the TFTs.

Among the TFTs, organic thin film transistors (OTFT) include an organic semiconductor instead of an inorganic semiconductor such as Si.

An OTFT panel having the OTFTs in a matrix alignment is quite different in structure and manufacturing processes compared to a conventional TFT.

For example, the OTFT panel may be manufactured by a solution process such as inkjet printing in which an organic solution is dripped into openings defined by a plurality of partitions. to form organic thin films such as organic semiconductors and insulating layers.

In this inkjet printing method, the partitions must be formed to confine the organic solution. However, because the partitions decrease the aperture ratio of the pixel, it is preferable that the partitions occupy a minimized area.

However, when the organic solution is dripped into the openings, the organic solution may overflow out of the openings and flow on to the pixels producing spots and causing the thicknesses of the organic thin films to be non-uniform, ultimately adversely affecting the characteristics of the thin film transistors.

SUMMARY OF THE INVENTION

In accordance with an aspect of the present invention a thin film transistor array panel having a uniform thickness as well as a high aperture ratio is achieved by forming a gate line and a pixel electrode on a substrate; forming a gate insulating layer on the gate line; forming a data line including a source electrode and a drain electrode on the gate insulating layer; forming an interlayer insulating layer covering the data line and the pixel electrode ; forming a first opening in the interlayer insulating layer; forming an organic semiconductor in the first opening; forming a passivation layer on the organic semiconductor and the interlayer insulating layer; and forming a second opening in the interlayer insulating layer to expose the pixel electrode.

The method for manufacturing the thin film transistor array panel may further comprise forming a protecting member on the organic semiconductor.

The second opening may be formed by etching the interlayer insulating layer using the passivation layer as an etch mask.

The gate line and the pixel electrode may be formed by depositing a first layer made of a transparent conductive material and a second layer made of a metallic material.

Forming the data line and the drain electrode may include sequentially depositing a third layer made of a transparent conductive material and a fourth layer made of a metallic material; forming a photoresist pattern including a first portion and a second portion thinner than the first portion; etching the fourth layer and third layer using the photoresist pattern as an etch mask; and etching the fourth layer using the first portion of the photoresist pattern as an etch mask.

The second layer of the pixel electrode may be etched when etching the fourth layer using the first portion of the photoresist pattern.

The second portion of the photoresist pattern may be aligned on the source electrode and the drain electrode.

The organic semiconductor may be formed by an ink-jet method.

A method for manufacturing a thin film transistor array panel according to an embodiment of the present invention includes forming a gate line including a gate electrode on a substrate; forming a gate insulating layer covering the gate line; forming a data line including a source electrode and a pixel electrode on the gate insulating layer; forming an interlayer insulating layer covering the data line and the pixel electrode; forming a first opening in the interlayer insulating layer; forming an organic semiconductor in the first opening; forming a passivation layer on the organic semiconductor and the interlayer insulating layer; and forming a second opening in the interlayer insulating layer to expose the pixel electrode.

The method for manufacturing the thin film transistor array panel may further include forming a protecting member on the organic semiconductor.

The second opening may be formed by etching the interlayer insulating layer using the passivation layer as an etch mask.

Forming the data line and the pixel electrode may include sequentially depositing a first layer made of a transparent conductive material and a second layer made of a metal material, and removing the portion of the second layer.

The organic semiconductor may be formed by an ink-jet method.

A thin film transistor array panel according to an embodiment of the present invention includes a substrate; a gate line formed on the substrate and including a gate electrode; a data line intersecting the gate line; a source electrode connected to the data line and a drain electrode facing the source electrode; an interlayer insulating layer covering the data line, the source electrode, and the drain electrode and having a first opening and a second opening; an organic semiconductor disposed in the first opening and contacted with the source electrode and the drain electrode; and a pixel electrode connected to the drain electrode and exposed through the second opening.

The pixel electrode may be formed on the same layer as the gate line.

The pixel electrode may be formed on the same layer as the data line.

The interlayer insulating layer may include a first portion disposed on the data line and the gate line, and a second portion protruding from the first portion of the portion where the gate line and the data line intersect, wherein the second portion may include the portion enclosing the organic semiconductor.

The thin film transistor array panel may further include a passivation layer formed on the interlayer insulating layer and the organic semiconductor, wherein the passivation layer has a third opening having the same plane shape as the second opening.

The thin film transistor array panel may further include a protecting member formed on the organic semiconductor.

The gate line and the pixel electrode may include a first layer made of a transparent conductive material and a second layer made of a metallic material.

The transparent conductive may be made of ITO or IZO.

The pixel electrode may include a first portion made of the first layer and the second layer, and a second portion where the second layer is removed, wherein the opening exposes the second portion.

The data line may include a first layer made of a transparent conductive material and a second layer made of a metallic material, wherein a first layer of the data line, the source electrode, and the drain electrode are made of the same material.

The first layer of the data line, the source electrode, and the drain electrode may be made of a transparent conductive material.

The transparent conductive material may be made of ITO or IZO.

BRIEF DESCRIPTION OF THE DRAWINGS

The present invention will become more apparent by describing embodiments thereof in detail with reference to the accompanying drawings, in which:

FIGS. 5 to 10 are sectional views showing the following steps of the OTFT array panel shown in FIGS. 3 and 4;

DETAILED DESCRIPTION OF EMBODIMENTS

It will be understood that when an element such as a layer, region, or substrate is referred to as being "on" another element, it can be directly on the other element or intervening elements may also be present. In contrast, when an element is referred to as being "directly on" another element, there are no intervening elements present.

An OTFT array panel for an LCD according to an embodiment of the present invention will be described with reference to FIGS. 1 and 2.

Figure 1:
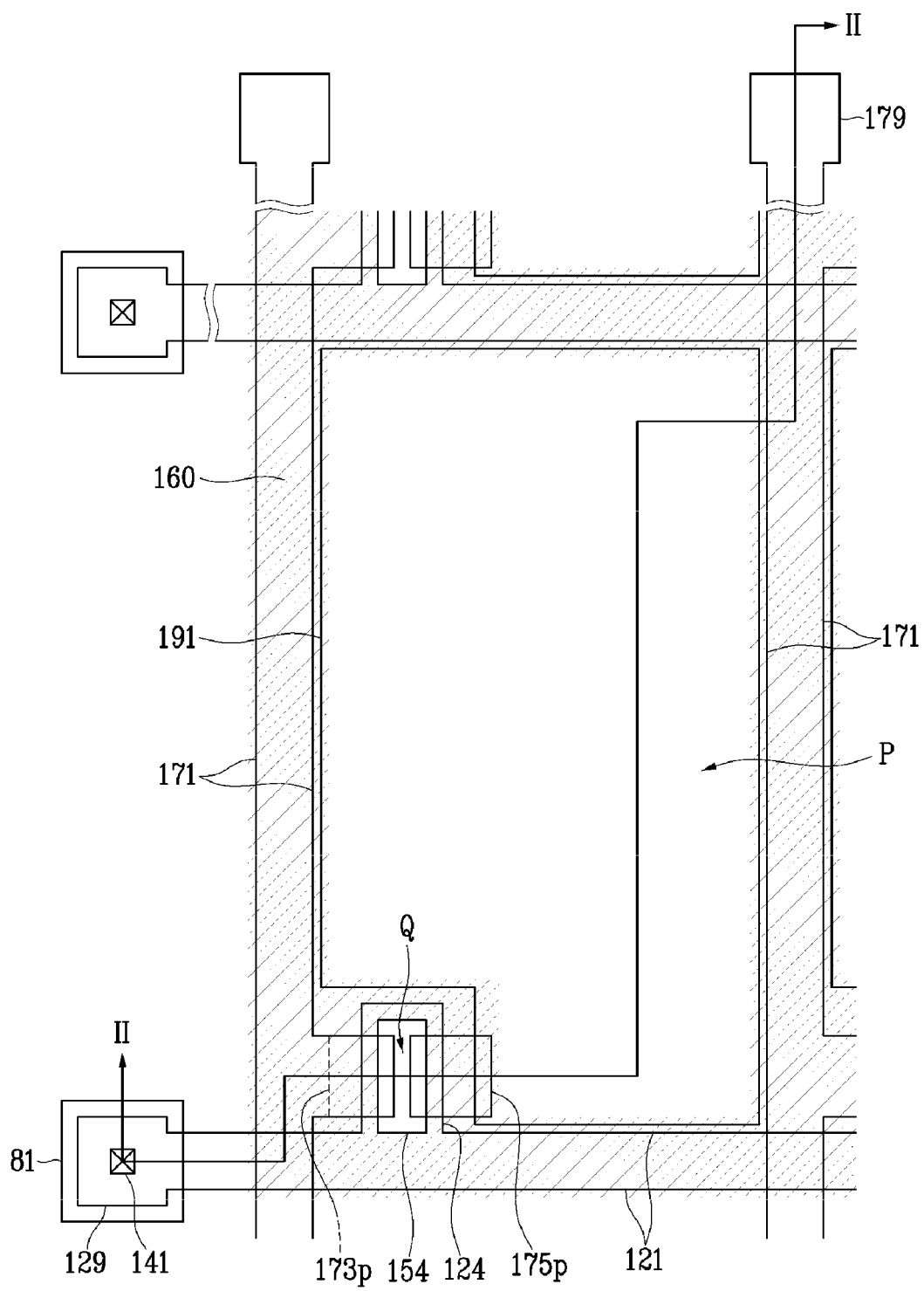
FIG. 1 is a layout view of an OTFT array panel according to an embodiment of the present invention.
Figure 2:
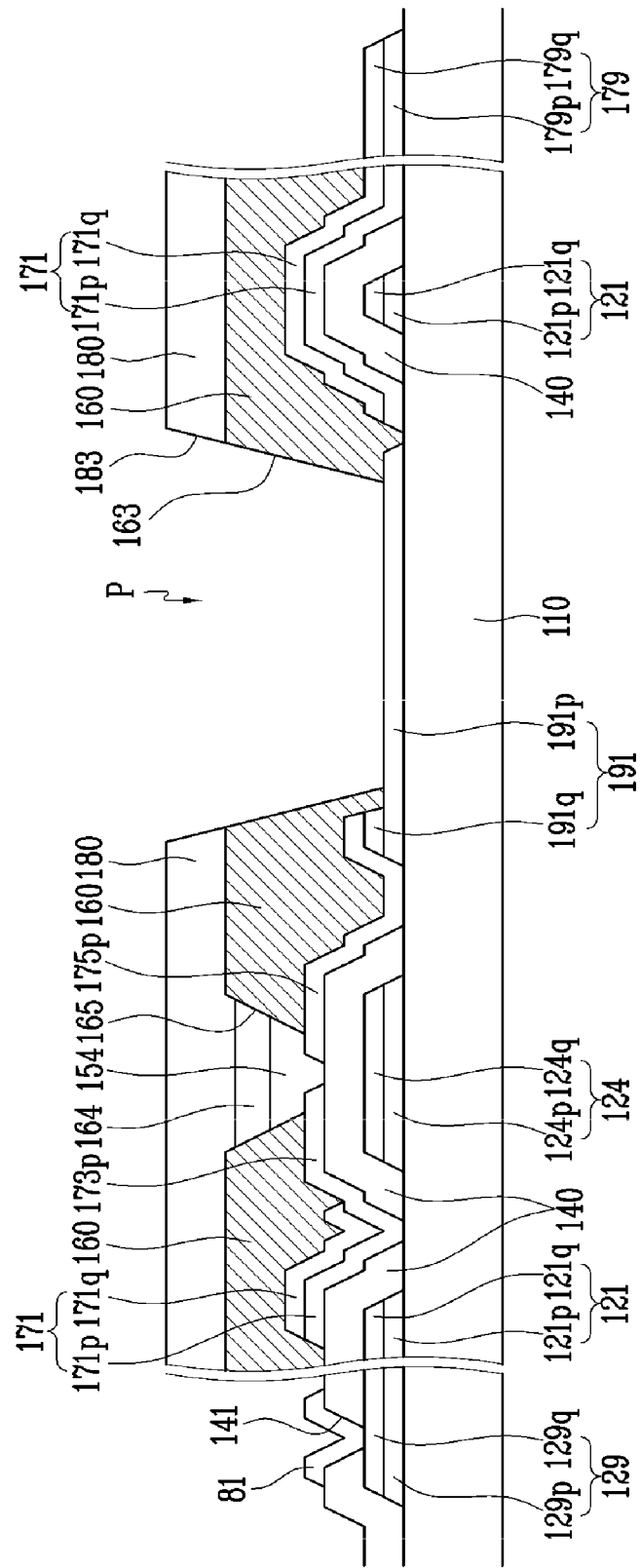
FIG. 2 is a sectional view of the OTFT array panel shown in FIG. 1 taken along the line II-II.

FIG. 1 is a layout view of an OTFT array panel according to an embodiment of the present invention, and FIG. 2 is a sectional view of the OTFT array panel shown in FIG. 1 taken along the line II-II.

As shown in FIGS. 1 and 2, a plurality of gate lines 121 and a plurality of pixel electrodes 191 are formed on an insulating substrate 110 made of a material such as transparent glass, silicone, or plastic.

The gate lines 121 transmit gate signals and extend substantially in a transverse direction. Each of the gate lines 121 includes a plurality of gate electrodes 124 projecting upward and an end portion 129 having a large area for contact with another layer or an external driving circuit.

Each of gate lines 121 includes a lower gate line 121p having a lower gate electrode 124p and a lower end portion 129p, and an upper gate line 121q having an upper gate electrode 124q and an upper end portion 129q.

The lower gate lines 121p are made of a transparent conductive material such as indium tin oxide (ITO) and indium zinc oxide (IZO), and the upper gate lines 121q are made of a metallic material having low resistivity such as Mo, Cr, Al, Cu, Ag, and alloy thereof.

The pixel electrodes 191 are separated from the gate lines 121 and disposed between two neighboring gate lines 121.

The pixel electrodes 191 include lower pixel electrodes 191p made of a transparent conductive material such as indium tin oxide and indium zinc oxide, and upper pixel electrodes 191q made of a metallic material having low resistivity. Here, the upper pixel electrodes 191q may be omitted.

The pixel electrodes 191 include a portion where the lower pixel electrodes 191p and the upper pixel electrode 191q are occupied and a portion where only the upper pixel electrodes 191q are occupied.

A gate insulating layer 140 is formed on the gate lines 121. The gate insulating layer 140 has a plurality of contact holes 141 exposing the end portion 129 of the gate lines 121. The gate insulating layer 140 may be made of a photosensitive organic insulator or inorganic insulator. The thickness of the insulating layer 140 may be from about 5000 Å to about 4 microns.

A plurality of data lines 171, a plurality of drain electrodes 175p, and a plurality of contact assistants 81 are formed on the gate insulating layer 140.

The data lines 171 are for transmitting data signals extend substantially in a longitudinal direction and intersect the gate lines 121. Each data line 171 includes a plurality of side projections 173*p*, and an end portion 179 having a large area for contact with another layer or an external driving circuit.

The data lines 171 are preferably made of double layers including lower data lines 171*p* and upper data lines 171*q*.

The lower data lines 171*p* include the source electrodes 173*p* and the end portions 179*p* and are preferably made of a transparent conductive material such as ITO and ITO.

The upper data lines 171*q* include end portions 179*q* and are removed on the source electrodes 173*p*. The upper data lines 171*q* are preferably made of a low resistivity metal including an Al-containing metal, a Ag-containing metal, a Cu-containing metal, a Mo-containing metal, or a Cr-containing metal. It is preferable that the upper and lower data lines 171*p* and 171*q* have different etch rates for high etch selectivity.

The drain electrodes 175*p* have island shapes and face the source electrodes 173*p* with respect to the gate electrodes 124. The drain electrodes 175*p* and the source electrodes 173*p* are also preferably made of a transparent conductive material such as ITO and ITO.

The pixel electrodes 191 are contacted and connected to the drain electrodes 175*p*, and receive data voltages from the organic TFT and generate an electric field in conjunction with a common electrode (not shown) of an opposing display panel (not shown) that is supplied with a common voltage, which determines the orientations of liquid crystal molecules (not shown) in a liquid crystal layer (not shown) disposed between the two electrodes, or induces a current for emitting of an emitting layer (not shown).

The contact assistants 81 are connected to the end portions 129 of the gate lines 121 through the contact holes 141, respectively. The contact assistants 81 protect the end portions 129 and enhance the adhesion between the end portions 129 and external devices. The contact assistants 81 are also preferably made of a transparent conductive material such as ITO and ITO.

An interlayer insulating layer 160 is formed on the data lines 171 and the drain electrodes 175*p*. The interlayer insulating layer 160 may be made of a photosensitive organic insulator, and the thickness of the interlayer insulating layer 160 may be from about 5000 Å to about 4 microns.

The interlayer insulating layer 160 has a plurality of first and second openings 165 and 163.

The first openings 165 are disposed on the gate electrodes 124 and expose portions of the drain electrode 175*p* and the source electrodes 173*p*. The second openings 163 are disposed between two neighboring gate lines 121 and expose the lower pixel electrodes 191*p*.

A plurality of organic semiconductor islands 154 are formed in the first openings 165.

The organic semiconductor islands 154 contact the source electrodes 173*p* and the drain electrodes 175*p*, and overlap the gate electrodes 124.

The organic semiconductor islands 154 may include a high molecular compound or a low molecular compound that is soluble in an aqueous solution or an organic solvent.

The organic semiconductor islands 154 may be made of or from derivatives of tetracene or pentacene with a substituent. Alternatively, the organic semiconductor islands 154 may be made of an oligothiophene including four to eight thiophenes connected at the positions 2 and 5 of thiophene rings.

The organic semiconductor islands 154 may be made of polythienylenevinylene, poly 3-hexylthiophene, polythiophene, phthalocyanine, or metallized phthalocyanine, or halogenated derivatives thereof. Alternatively, the organic semiconductor islands 154 may be made of perylene tetracarboxylic dianhydride (PTCDA), naphthalene tetracarboxylic dianhydride (NTCDA), or their imide derivatives. The organic semiconductor islands 154 may also be made of perylene, coronene, or derivatives thereof with a substituent.

The thickness of the organic semiconductor islands 154 may be in the range of about 300 angstroms to about 1 micron.

A plurality of protecting members 164 are formed on the organic semiconductor islands 154.

The protecting members 164 may be made of an inorganic insulator or an organic insulator, and alternatively, the protecting members 164 may be omitted. The protecting members 164 may be made of a fluorine polymer compound or a parylene compound. The protecting members 164 protect the organic semiconductor islands 154 from being damaged in the manufacturing process.

The interlayer insulating layer 160 defining the first openings 165 serves as a bank against the protecting member 164 and the organic semiconductor islands 154. As shown in FIG. 1, the interlayer insulating layer 160 includes linear portions covering the gate lines 121 and the data lines 171, and protrusions disposed on the gate electrode 124, the drain electrodes 175*p*, and the sources electrodes 173*p* and serving as a bank against the organic semiconductor islands 154. The interlayer insulating layer 160 covers the whole substrate except for the portions corresponding to the first and second openings 165 and 163, and the end portions 129 and 179 of the gate lines 121 and the data lines 171.

A passivation layer 180 is formed in the interlayer insulating layer 160 and the protecting members 164. The passivation layer 180 has a plurality of third openings 183 having the same plane shape as the second openings 163 for exposing the lower pixel electrodes 191*p* corresponding to a plurality of pixel regions P.

A gate electrode 124, a source electrode 173*p*, a drain electrode 175*p*, and an organic semiconductor island 154 form an organic TFT. The TFT has a channel Q formed in the organic semiconductor island 154 disposed between the source electrode 173*p* and the drain electrode 175*p*. When the opposing sides of the source electrodes 173*p* and the drain electrodes 175*p* are curved, the width of the channel Q may be maximized such that the current characteristics of the organic TFT may be improved.

As above-described, the interlayer insulating layer 160 only covers the gate lines 121, the data lines 171, and the organic TFT in the embodiment according to the present invention such that a reduction of the aperture ration is prevented and a pixel region P with enough area may be obtained.

Also, the data lines 171, the drain electrodes 175*p*, and the source electrodes 173*p* are disposed in the same layer such that the number of masks may be reduced and the manufacturing process may be simplified.

Here, the data lines 171 are made of the metal having low resistivity such that signal delay and voltage drop may be prevented.

The difference in the work function between an organic semiconductor and the ITO layer or IZO layer may be so small that charge carriers can be effectively injected into the organic semiconductor from the source electrode 173*p* and the drain electrode 175*p* that are made of ITO or IZO. When the difference in the work function is small, a Schottky barrier generated between the organic semiconductor 154 and the electrodes 173*p* and 175*p* may easily allow the injection and transport of the charge carriers.

A method of manufacturing the OTFT array panel shown in FIGS. 1 and 2 according to an embodiment of the present invention will be described in detail with reference to FIGS. 3-16, as well as FIGS. 1 and 2.

Figure 3:
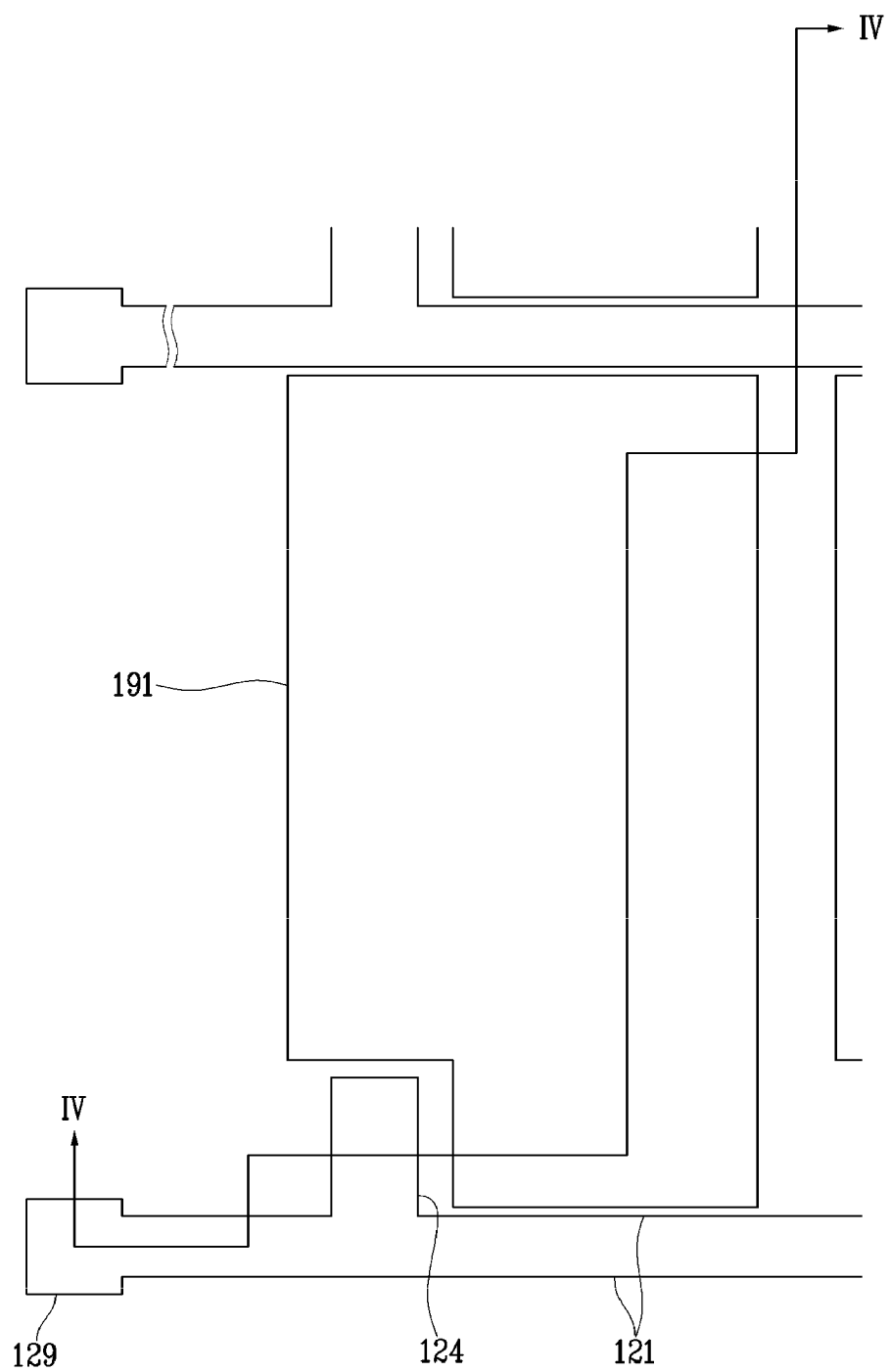
FIGS. 3, 10, 12, and 14 are layout views of the OTFT array panel shown in FIGS. 1 and 2 in intermediate steps of a manufacturing method thereof according to an embodiment of the present invention.
Figure 4:
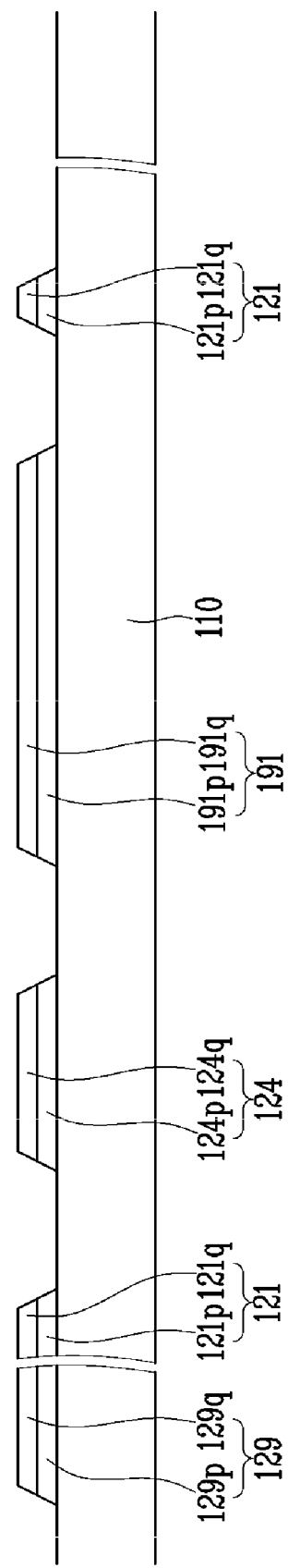
FIG. 4 is a sectional view of the OTFT array panel shown in FIG. 3 taken along the line IV-IV.
Figure 8:
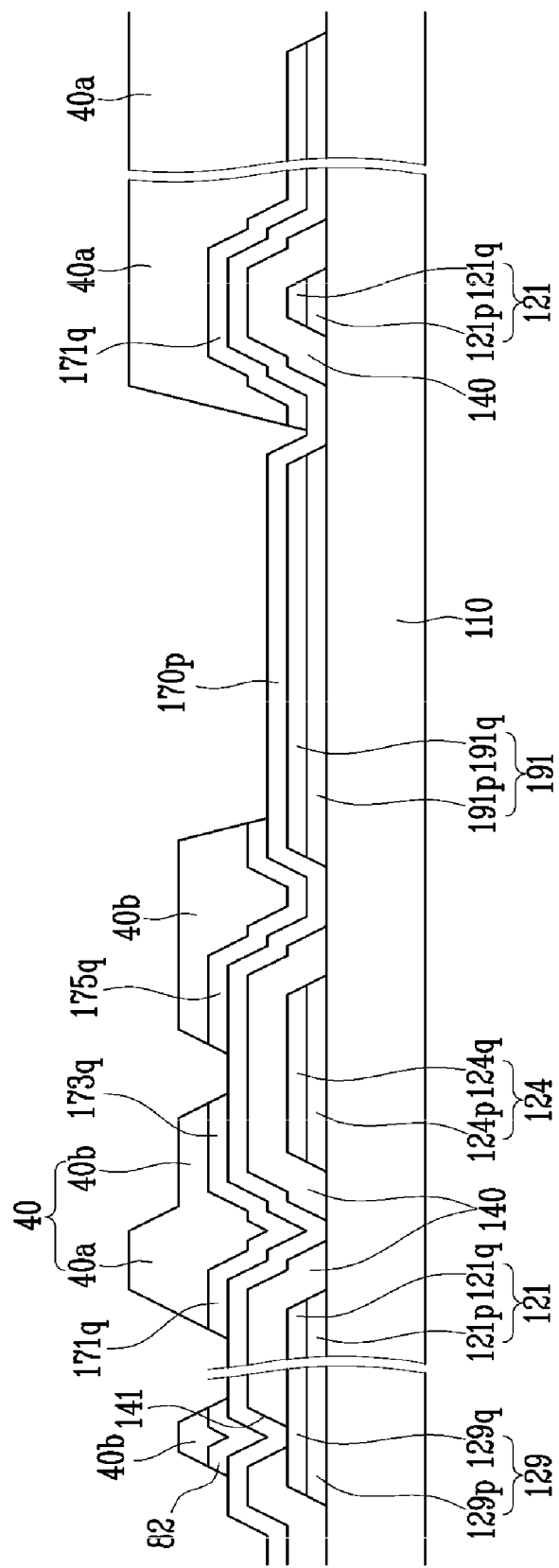
Figure 9:
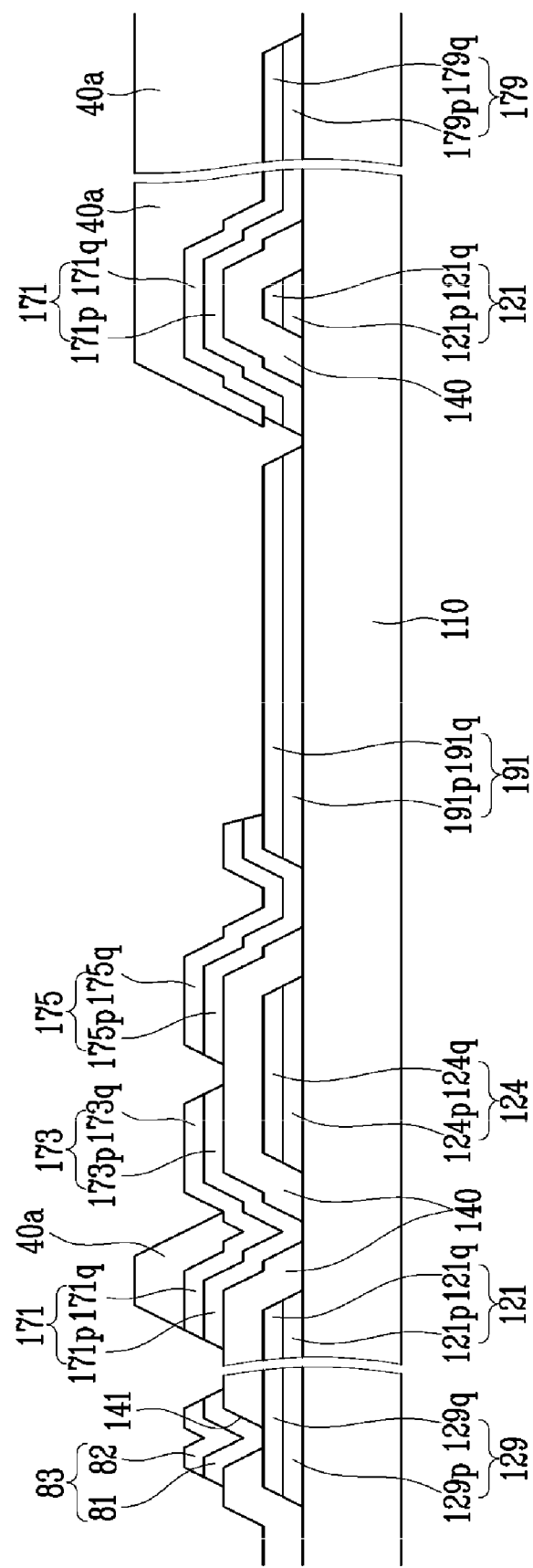
Figure 10:
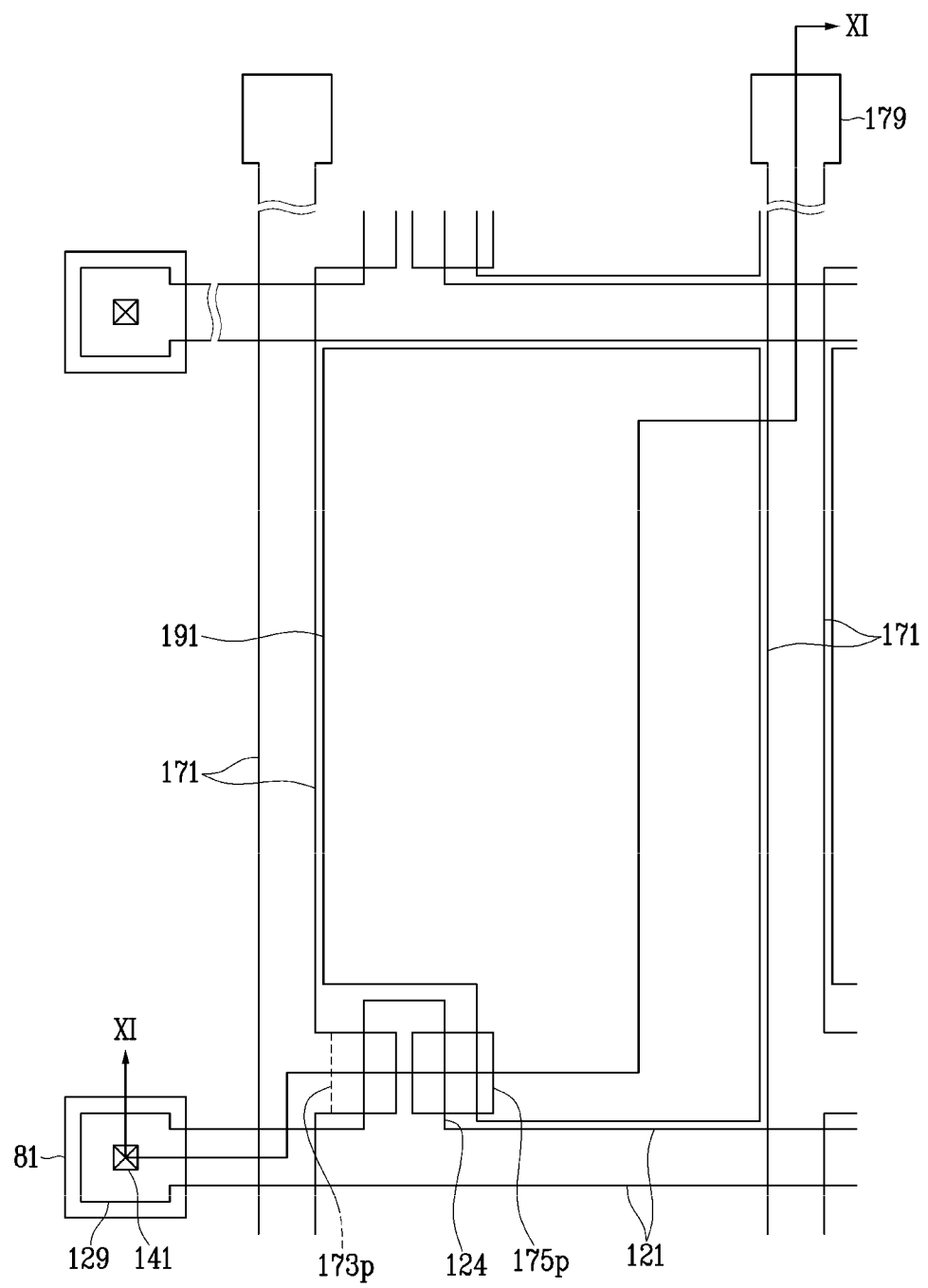
Figure 11:
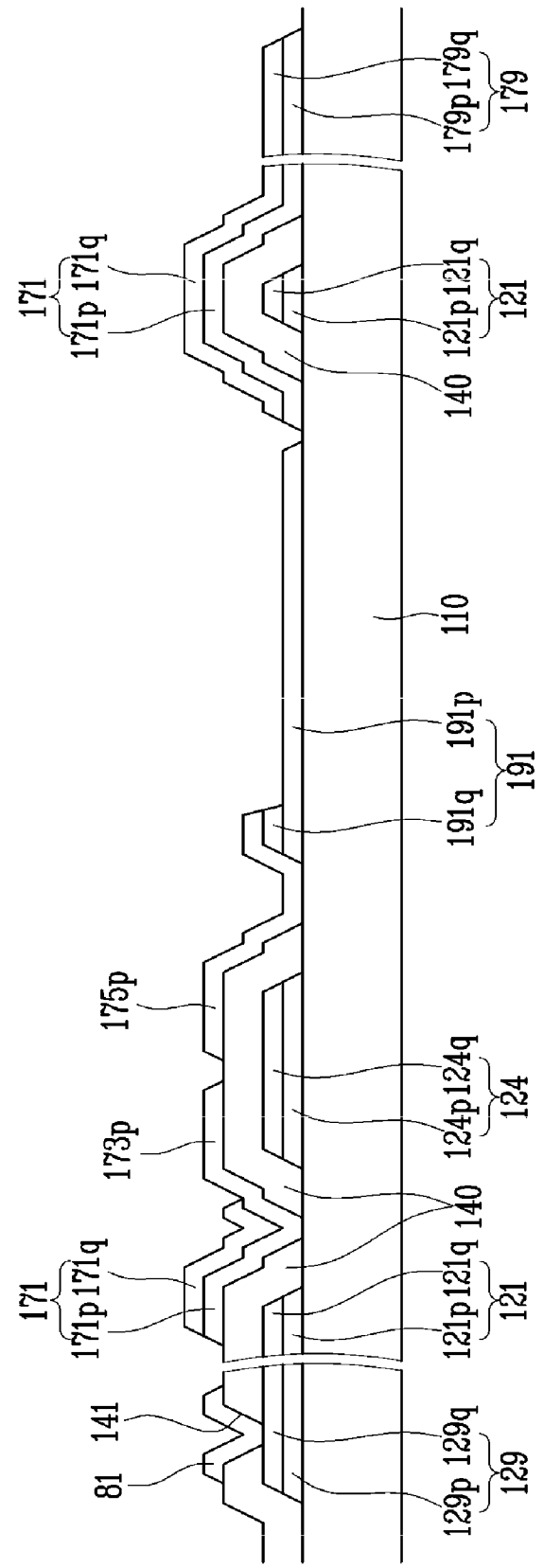
FIG. 11 is a sectional view of the OTFT array panel shown in FIG. 10 taken along the line XI-XI.
Figure 12:
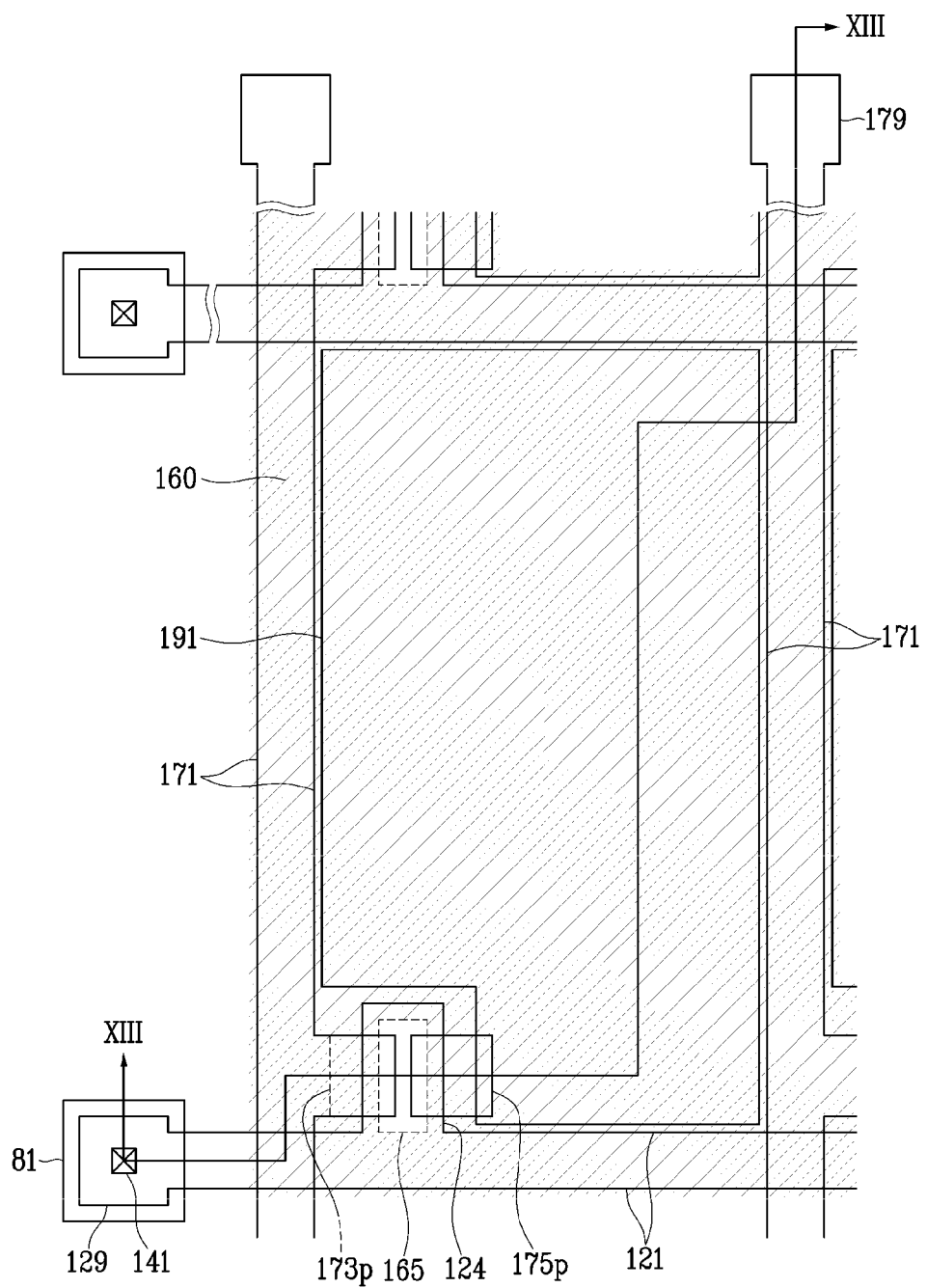
Figure 13:
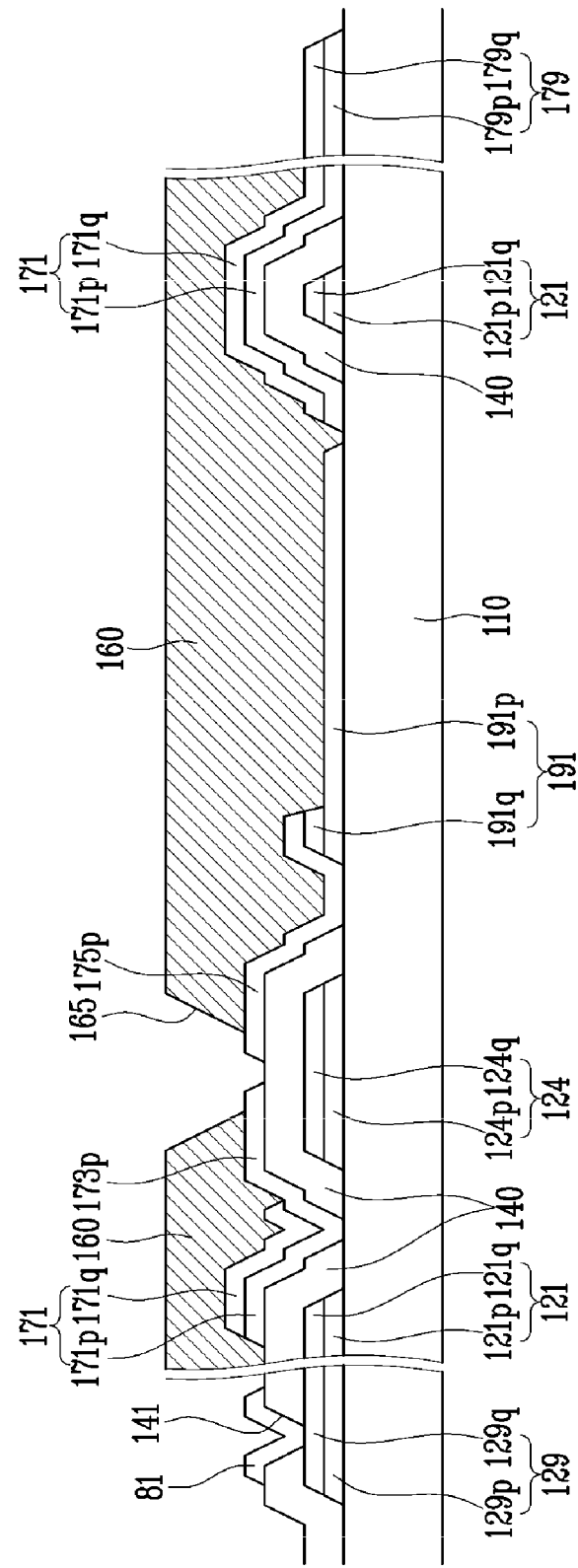
FIG. 13 is a sectional view of the OTFT array panel shown in FIG. 12 taken along the line XIII-XIII.
Figure 14:
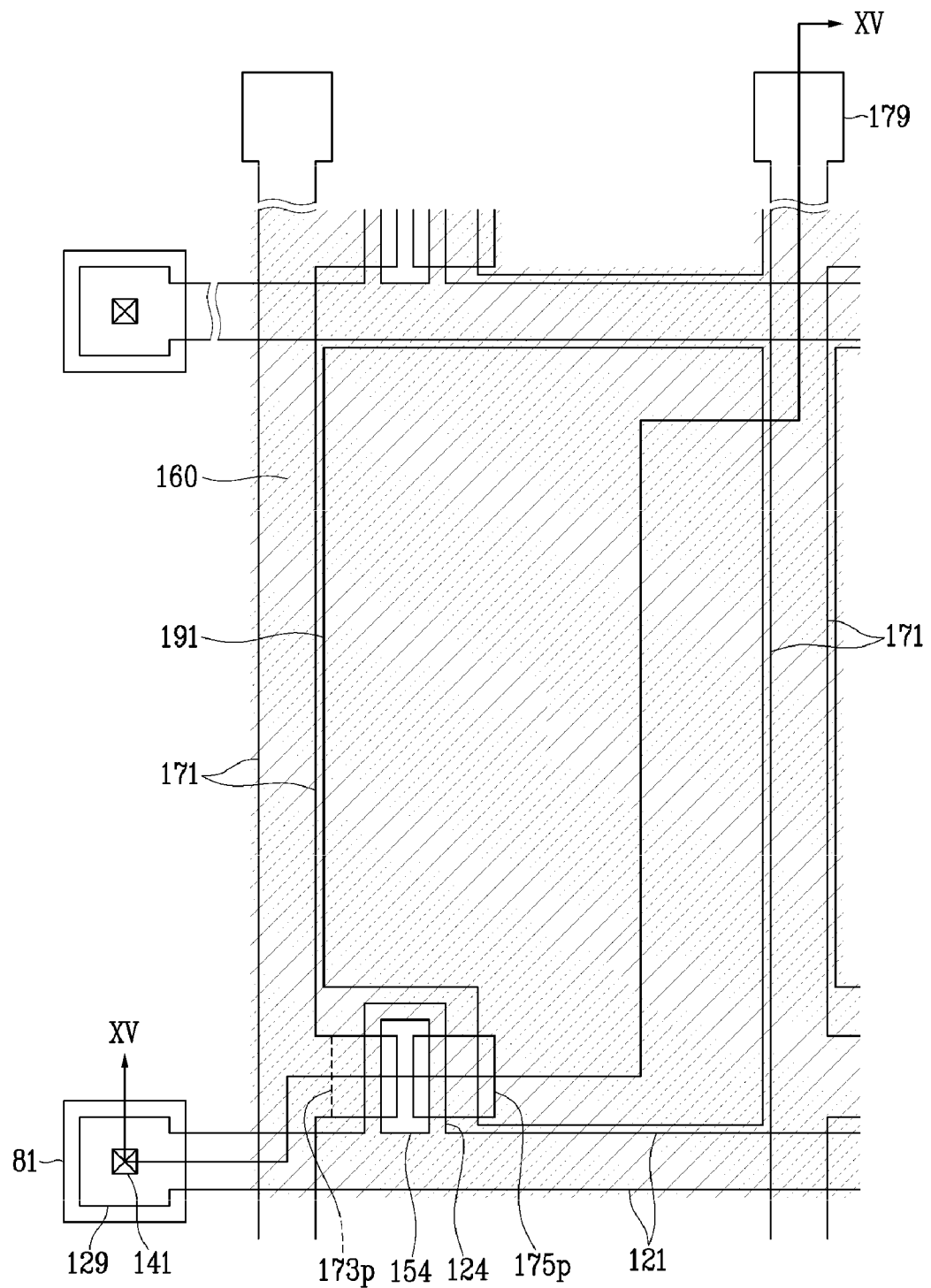
Figure 15:
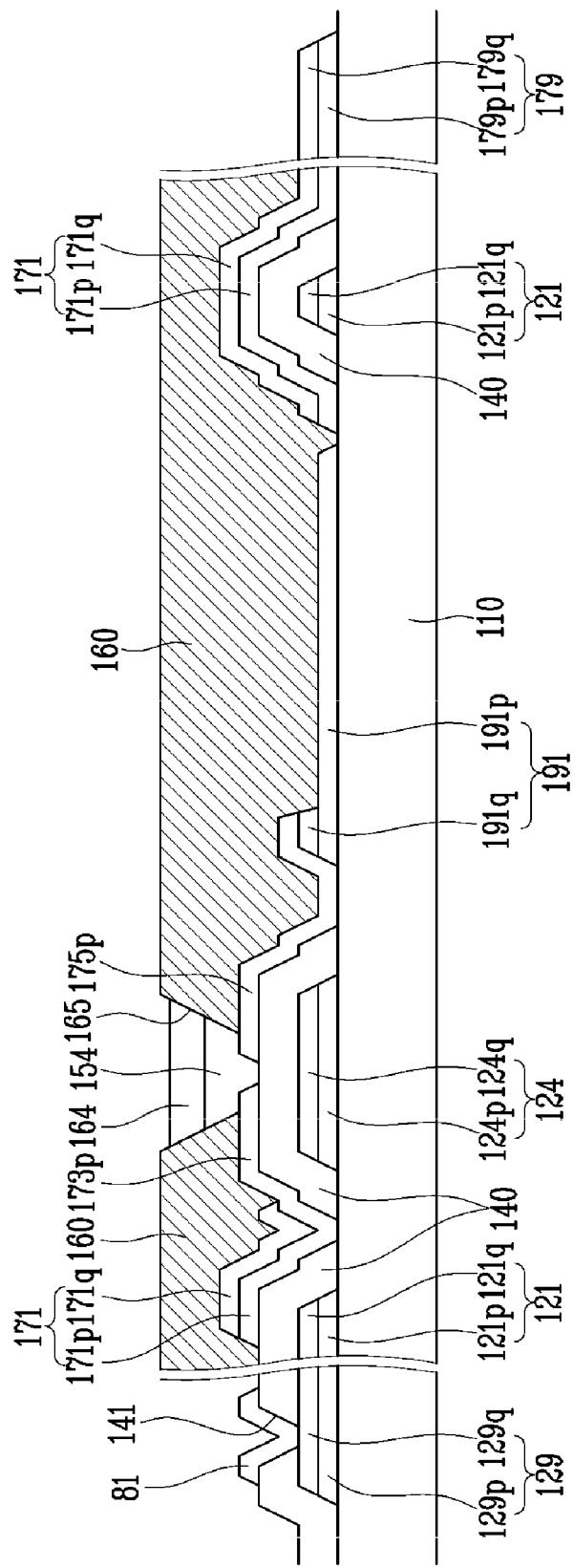
FIG. 15 is a sectional view of the OTFT array panel shown in FIG. 14 taken along the line XV-XV.
Figure 16:
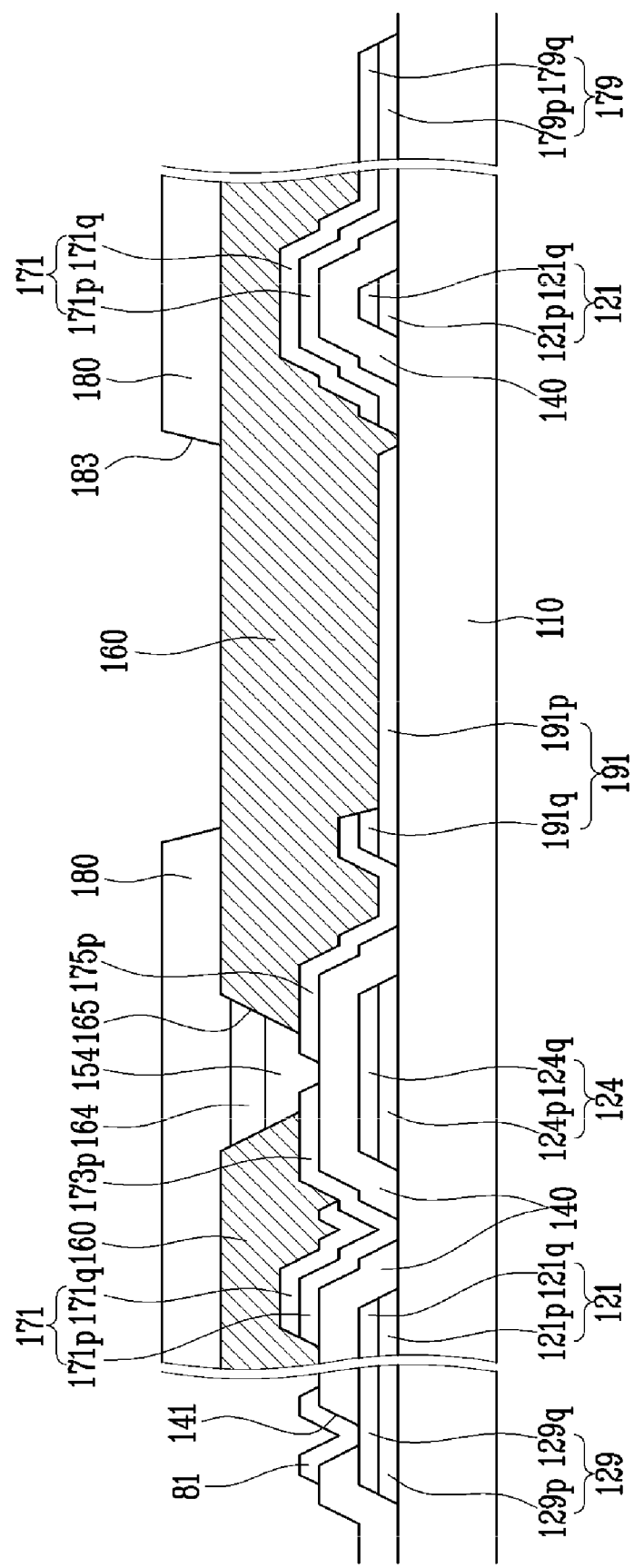
FIG. 16 is a sectional view showing the following steps of the OTFT array panel shown in FIGS. 14 and 15.

FIGS. 3, 10, 12, and 14 are layout views of the OTFT array panel shown in FIGS. 1 and 2 in intermediate steps of a manufacturing method thereof according to an embodiment of the present invention, FIG. 4 is a sectional view of the OTFT array panel shown in FIG. 3 taken along the line IV-IV, FIGS. 5 to 10 are sectional views showing the following steps of the OTFT array panel shown in FIGS. 3 and 4, FIG. 11 is a sectional view of the OTFT array panel shown in FIG. 10 taken along the line XI-XI, FIG. 13 is a sectional view of the OTFT array panel shown in FIG. 12 taken along the line XIII-XIII, FIG. 15 is a sectional view of the OTFT array panel shown in FIG. 14 taken along the line XV-XV, and FIG. 16 is a sectional view showing the following steps of the OTFT array panel shown in FIGS. 14 and 15.

Referring to FIGS. 3 and 4, a first layer made of ITO and a second layer including Mo are sequentially deposited on a substrate 110 by using sputtering, etc., and are sequentially patterned by lithography and etching using a Mo etchant and an ITO etchant to form a lower conductive layer including a plurality of lower gate lines 121$p$, 124$p$, and 129$p$ and a plurality of lower pixel electrodes 191$p$, and an upper conductive layer including a plurality of upper gate lines 121$q$, 124$q$, and 129$q$ and a plurality of upper pixel electrodes 191$q$.

Figure 5:
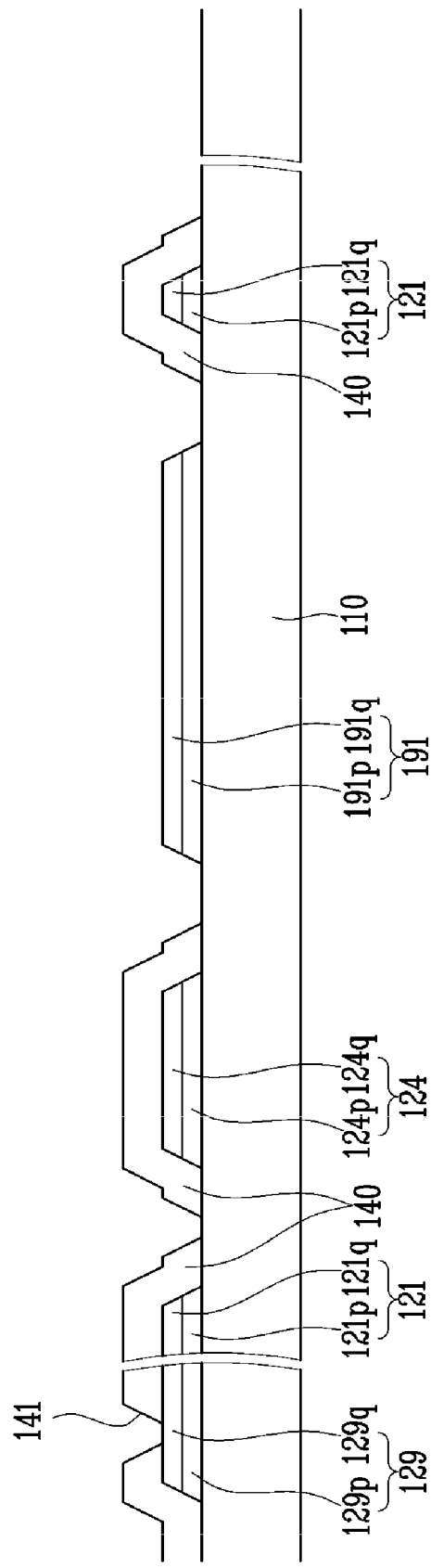

Referring to FIG. 5, a gate insulating layer 140 including a plurality of contact holes 141 is formed by deposition and patterning.

Figure 6:
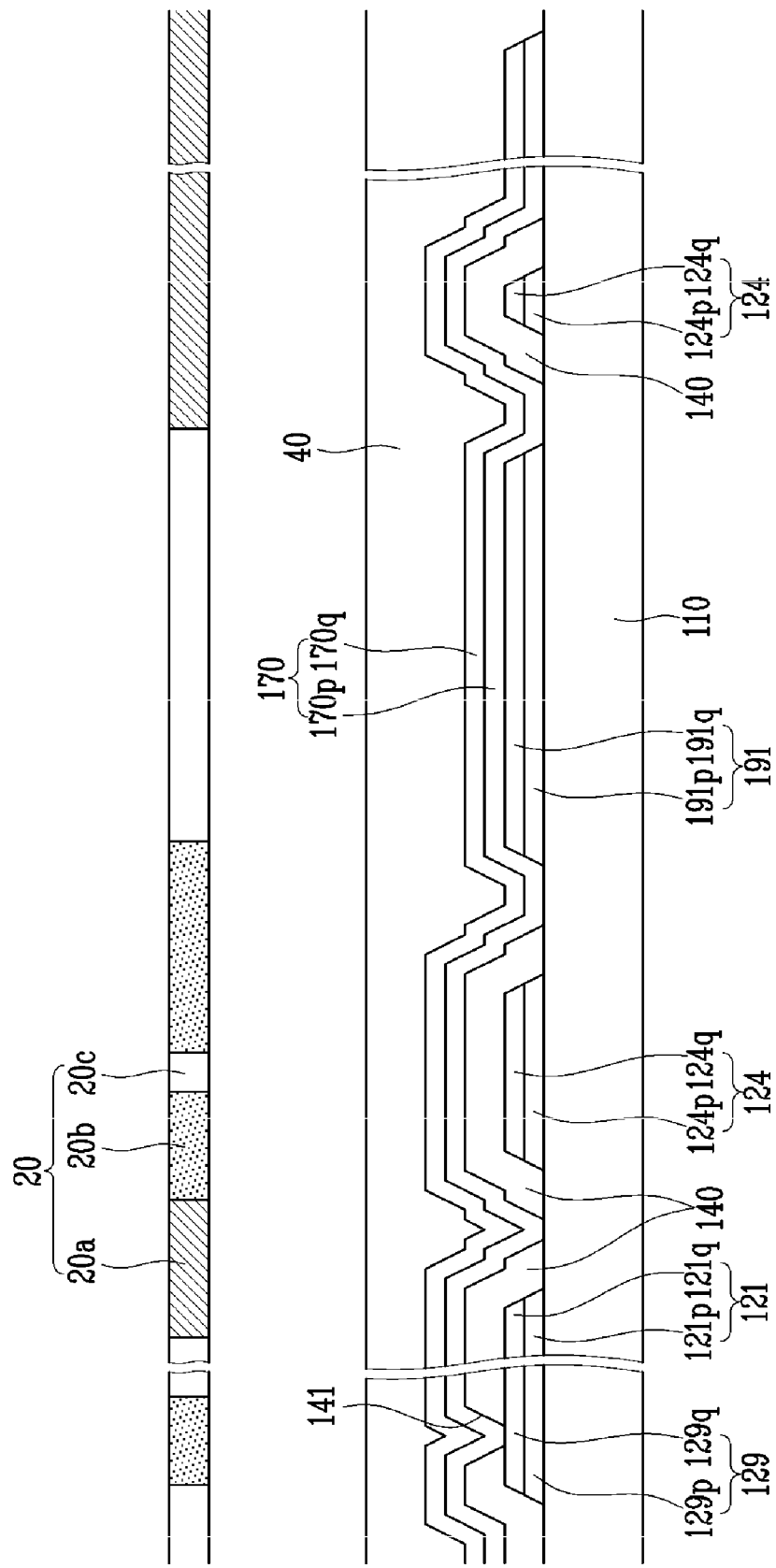

Next, referring to FIG. 6, a first layer 170$p$ made of ITO and a second layer 170$q$ including Mo are sequentially deposited on a substrate 110 by using sputtering, etc.

Then, a photoresist layer 40 is coated on the conductive layer 170 of the first and the second layers 170$p$, 170$q$, and is exposed using a mask 20 which is aligned with the second layer 170$q$. The mask 20 includes translucent areas 20$b$ on the exposure mask as well as transparent areas 20$a$ and light blocking opaque areas 20$c$. The translucent areas 20$b$ may have a slit pattern or a lattice pattern, or they may be a thin film(s) with intermediate transmittance or intermediate thickness. When using a slit pattern, it is preferable that the width of the slits or the distance between the slits is smaller than the resolution of a light exposer used for the photolithography.

Figure 7:
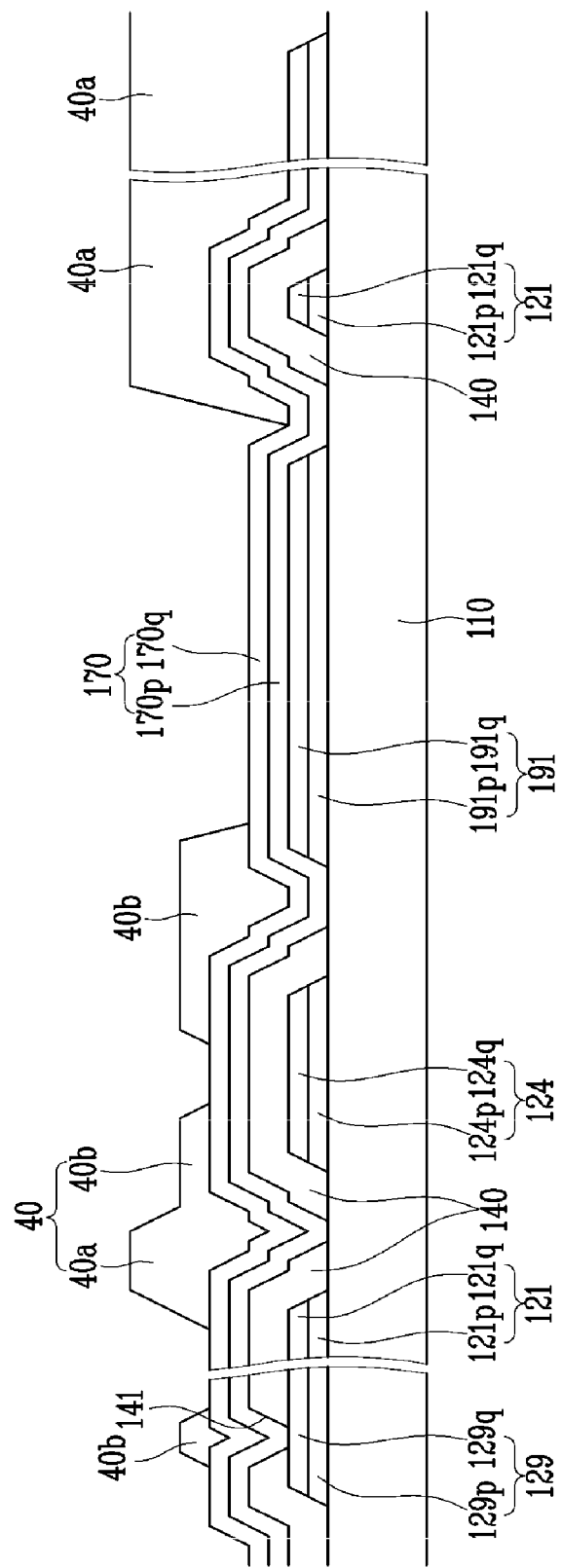

Next, as shown in FIG. 7, the photoresist layer 40 on the conductive layer 170 is developed to form photoresist patterns 40$a$ and 40$b$ having position-dependent thicknesses. The first photoresist patterns 40$a$ are located on areas corresponding a plurality of data lines 171 except for a plurality of source electrodes 173$p$, and the second photoresist patterns 40$b$ that are thinner than the first photoresist patterns are located on areas corresponding to the source electrodes 173$b$ and a plurality of drain electrodes 175$p$. The thickness ratio of the photoresist patterns 40$a$ and 40$b$ is adjusted depending upon the process conditions in the subsequent process steps. For example, the thickness of the second photoresist patterns 40$b$ may be equal to or less than half of the thickness of the first photoresist patterns 40$a$.

Referring to FIG. 8, the second layer 170$q$ is wet-etched using the photoresist patterns 40$a$ and 40$b$ as an etch mask to form a plurality of upper data lines 171$q$ and a plurality of upper data patterns 82, 173$q$, and 175$q$. Here, an etchant for etching the MO containing-metal layer is used such that the first layer 170$p$ made of ITO is not etched due to its high etch selectivity.

Next, the first layer 170$p$ is wet-etched using the upper data lines 171$q$ and the upper data patterns 82, 173$q$, and 175$q$ as an etch mask. Here, an etchant for etching the ITO layer is used.

Referring to FIG. 9, the second photoresist patterns 40$b$ are removed by an etch-back process such as ashing. At the same time, some amount of the exposed portions of the first photoresist patterns 40$a$ are removed, thereby decreasing the thickness of the remaining first photoresist patterns 40$a$.

The exposed upper data patterns 82, 173$q$, and 175$q$ are etched using the first photoresist patterns 40$a$ as an etch mask. Here, the etchant for etching the Mo-containing metal layer is used such that the upper pixel electrodes 191$q$ are etched and the lower pixel electrodes 191$p$ are exposed.

Next, the first photoresist patterns 40$a$ are removed.

Accordingly, as shown in FIGS. 10 and 11, a plurality of data lines 171 made as double layers are formed and a plurality of source and drain electrodes 173$p$ and 175$p$ made as single layers are formed.

Subsequently, as shown in FIGS. 12 and 13, an organic photosensitive layer is coated on the substrate 110 and is developed to form an interlayer insulating layer 160 having a plurality of openings 165 exposing the portions of the source and drain electrodes 173$p$ and 175$p$. The portions of the interlayer insulating layer 160 disposed on the end portions 129 and 179 of the gate lines 121 and the data lines 171 are removed.

As shown in FIGS. 14 and 15, a plurality of organic semiconductor islands 154 and a plurality of protecting members 164 are sequentially formed in the openings 165 by inkjet printing, etc. To form the organic semiconductor islands 154, it is necessary that an organic semiconductor solution be dripped into the openings 165 and the solution dried.

Because the interlayer insulating layer 160 covers the whole area except for the openings 165, the organic semiconductor solution is easily controlled or gathered. Also, any organic semiconductor solution that overflows out of the openings 165 and is deposited on misaligned positions by misalignment of the ink-jet head does not flow into the pixel regions P and may be easily removed in the following processes.

Next, as shown in FIG. 16, a passivation layer 180 having a plurality of openings 183 is formed on the interlayer insulating layer 160 and the protecting members 164. When forming the passivation layer 180 made of a photosensitive material, the passivation layer 180 is completed by the exposure step and the developing step, and when forming the passivation layer 180 made of a non-photosensitive material, an additional photolithography process is necessary to complete the passivation layer 180.

Finally, referring to FIGS. 1 and 2, the interlayer insulating layer 160 is etched using the passivation layer 180 as an etch mask to form a plurality of openings 163 exposing the lower pixel electrodes 191$p$.

As above-described, the interlayer insulating layer 160 only covers the gate lines 121, the data lines 171, and the organic TFT in the embodiment according to the present invention such that a reduction of the aperture ration may be prevented.

Because the interlayer insulating layer 160 covers the whole area except for the openings 165 when forming the organic semiconductors, the organic semiconductor solution is prevented from overflowing and flowing into the pixel regions P. Also, the organic semiconductors may be formed with a uniform thickness such that the characteristics of the organic TFT may be improved.

Also, the pixel electrodes may be exposed by patterning the interlayer insulating layer using the passivation layer as an etch mask without an additional mask after forming the organic semiconductors.

Furthermore, the gate lines 121 and the pixel electrodes are formed using one mask such the number of masks may be minimized.

An OTFT array panel for an LCD according to another embodiment of the present invention will be described with reference to FIGS. 17 and 18.

Figure 17:
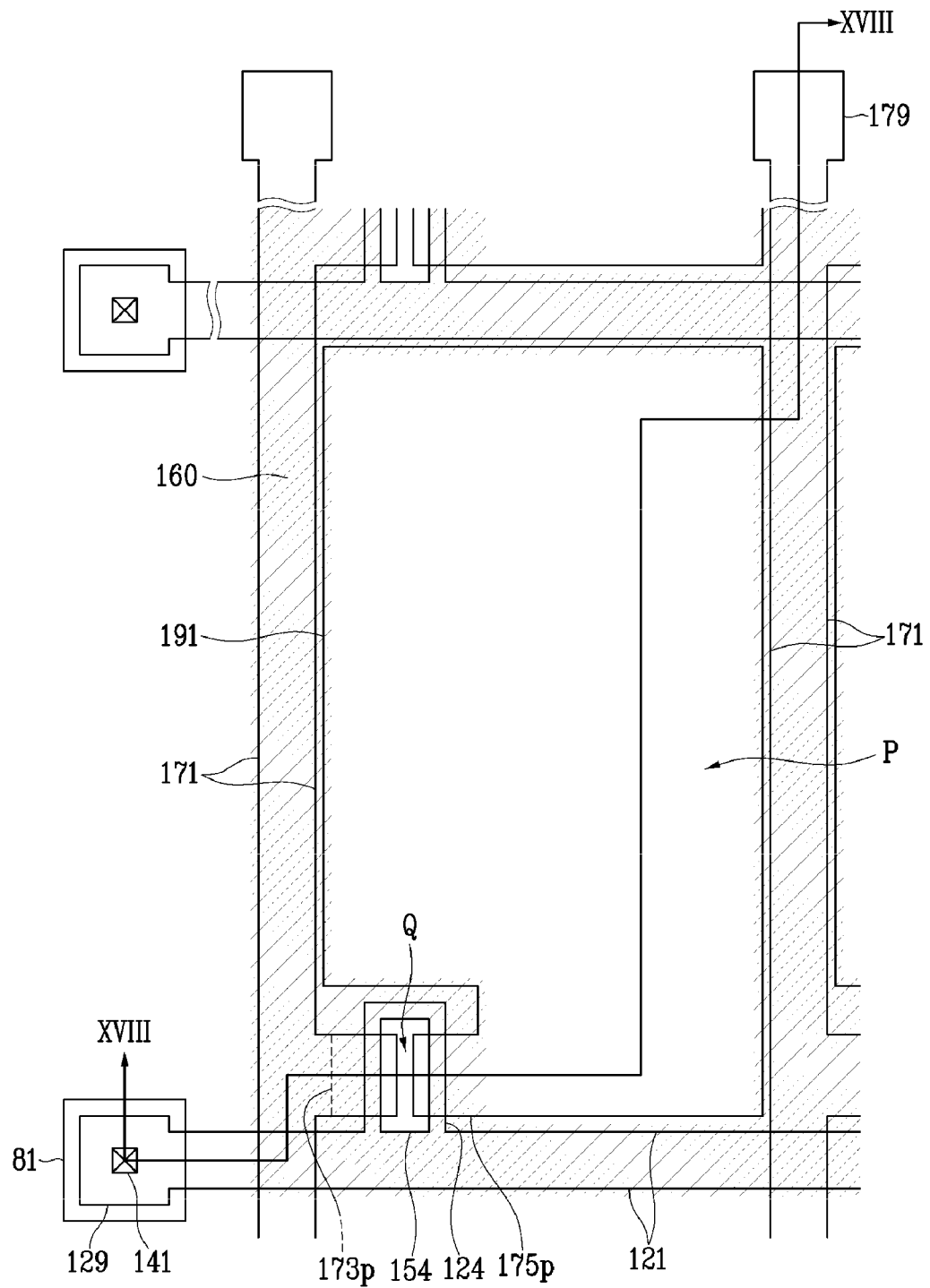
FIG. 17 is a layout view of an OTFT array panel according to another embodiment of the present invention.
Figure 18:
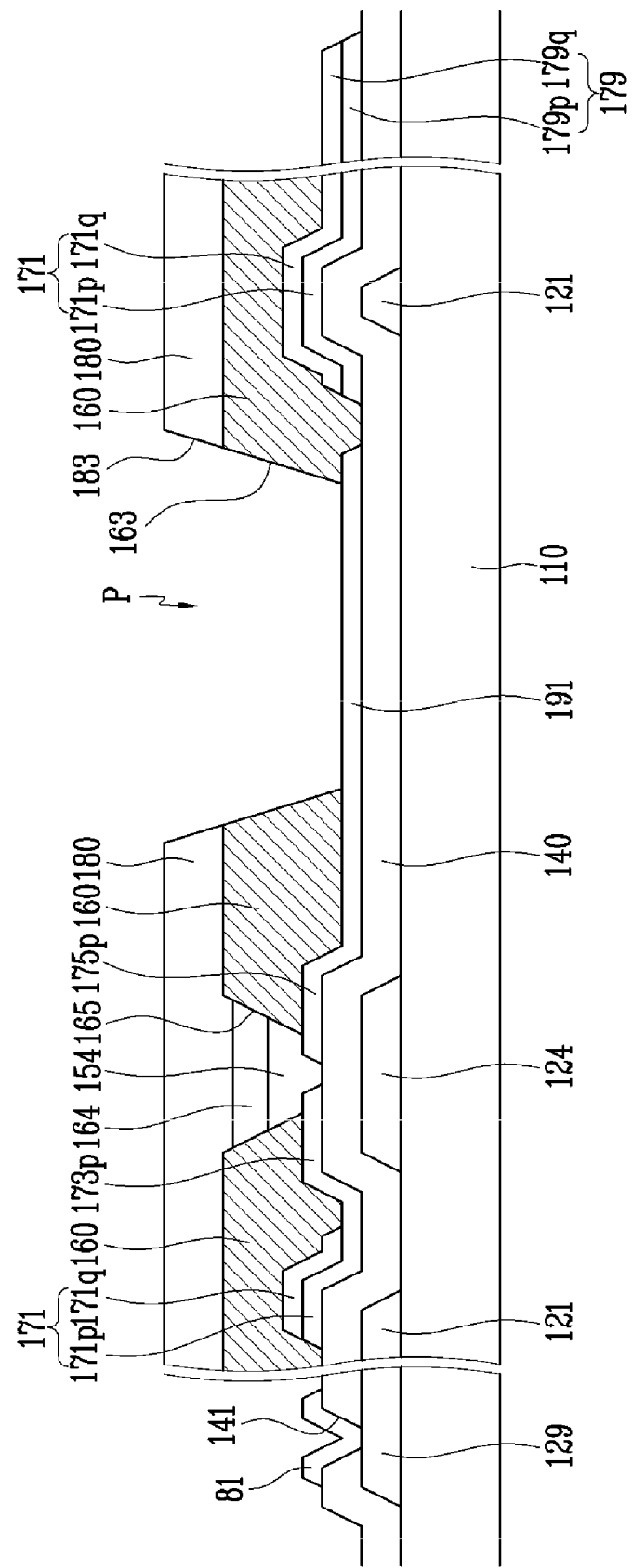
FIG. 18 is a sectional view of the OTFT array panel shown in FIG. 17 taken along the line XVIII-XVIII.

FIG. 17 is a layout view of an OTFT array panel according to another embodiment of the present invention, and FIG. 18 is a sectional view of the OTFT array panel shown in FIG. 17 taken along the line XVIII-XVIII.

In this embodiment, the pixel electrodes are disposed with the same layer as the data lines 171, and portions of the pixel electrodes 191 form the drain electrodes 175p. Descriptions for the elements will follow, and overlapping descriptions are omitted.

As shown in FIGS. 17 and 18, a plurality of gate lines 121 including gate electrodes 124 and end portions 129 are formed on an insulating substrate 110.

The gate lines 121 are made of single layers having low resistivity, but the gate lines 121 may be formed of multi-layers made of metal materials having different physical characteristics.

A gate insulating layer 140 is formed on the gate lines 121. The gate insulating layer 140 covers the whole substrate 110 and has a plurality of contact holes 141 exposing the end portions 129 of the gate lines 121.

A plurality of data lines 171, a plurality of pixel electrodes 191, and a plurality of contact assistants 81 are formed on the gate insulating layer 140.

The data lines 171 include lower data lines 171p and upper data lines 171q.

The lower data lines 171p are preferably made of a transparent conductive material such as ITO and ITO and include a plurality of source electrodes 173p, and the upper data lines 171q are preferably made of a low resistivity metal.

The pixel electrodes are preferably made of a single layer of a transparent conductive oxide material such as ITO and ITO, and include a plurality of drain electrodes 175p facing the source electrodes 173p on the gate electrodes 124.

An interlayer insulating layer 160 is formed on the data lines 171 and the pixel electrodes 191. The interlayer insulating layer 160 has a plurality of first and second openings 165 and 163. The first openings 165 are disposed on the gate electrodes 124 and expose the portions of the drain electrode 175p and the source electrodes 173p, and the second openings 163 expose the pixel electrodes 191.

A plurality of organic semiconductor islands 154 are formed in the first openings 165, and a plurality of protecting members 164 are formed on the organic semiconductor islands 154.

The second openings 163 exposing the pixel electrodes 191 define a plurality of pixel regions P.

A passivation layer 180 is formed in the interlayer insulating layer 160 and the protecting members 164. The passivation layer 180 has a plurality of third openings 183 having the same plane shape as the second openings 163 for exposing the pixel electrodes 191 corresponding to the pixel regions P.

A method of manufacturing the OTFT array panel shown in FIGS. 17 and 18 according to an embodiment of the present invention will be described in detail with reference to FIGS. 19-27, as well as FIGS. 17 and 18.

Figure 19:
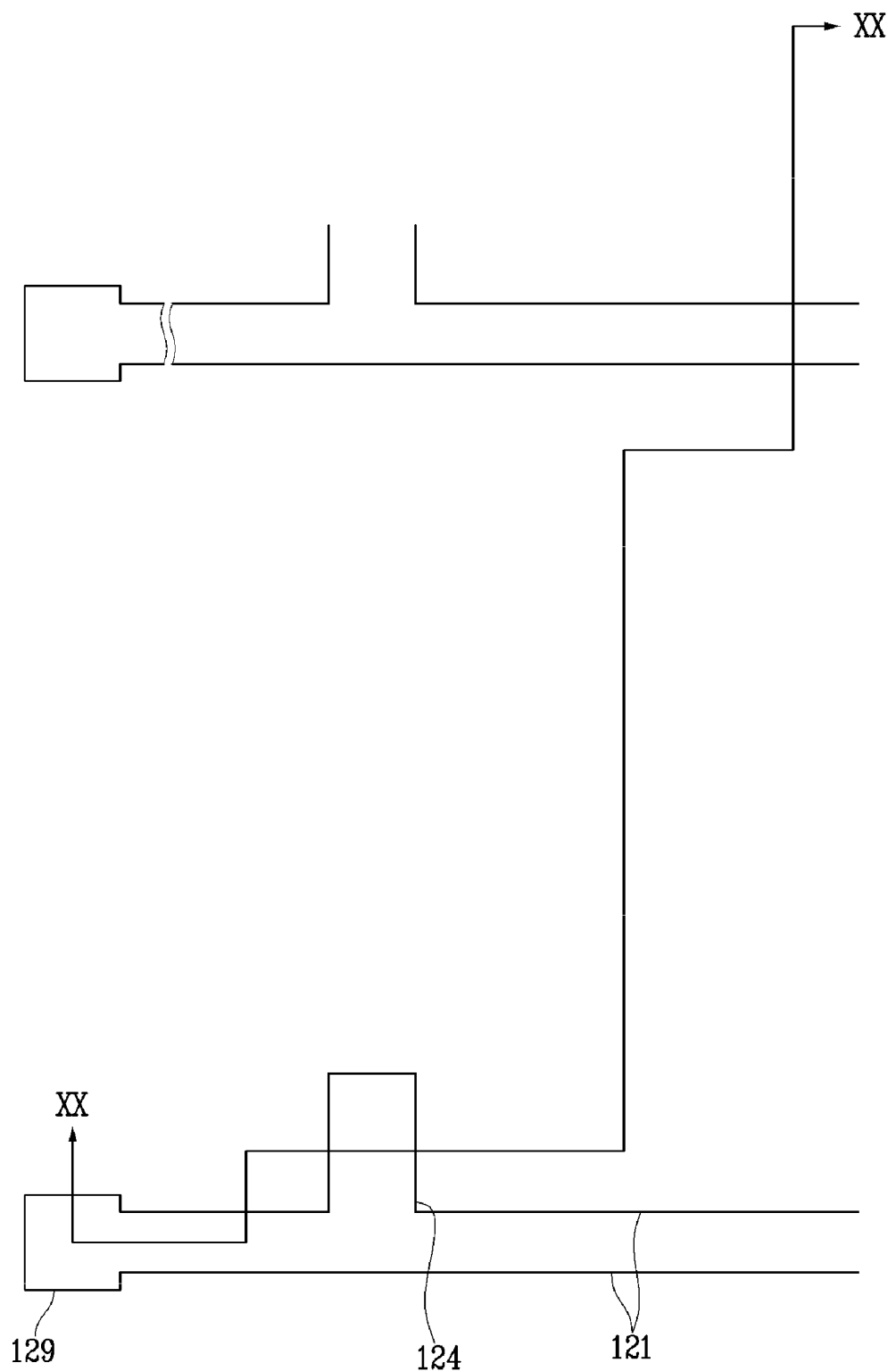
FIGS. 19, 21, 23, and 25 are layout views of the OTFT array panel shown in FIGS. 17 and 18 in intermediate steps of a manufacturing method thereof according to an embodiment of the present invention.
Figure 20:
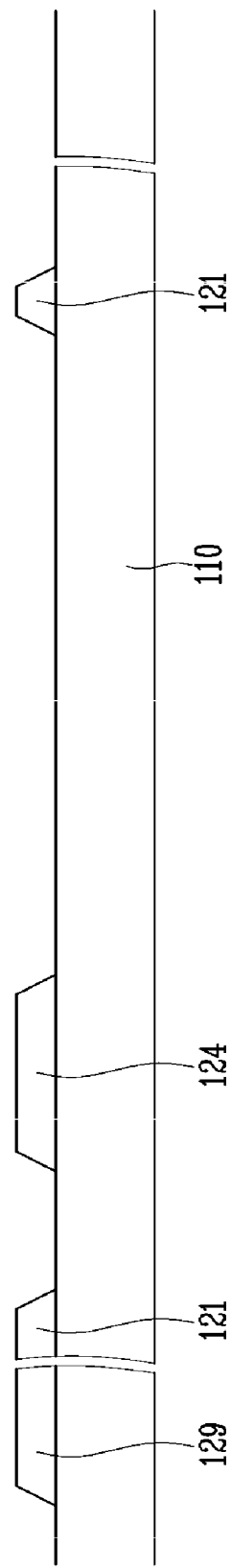
FIG. 20 is a sectional view of the OTFT array panel shown in FIG. 19 taken along the line XX-XX.
Figure 21:
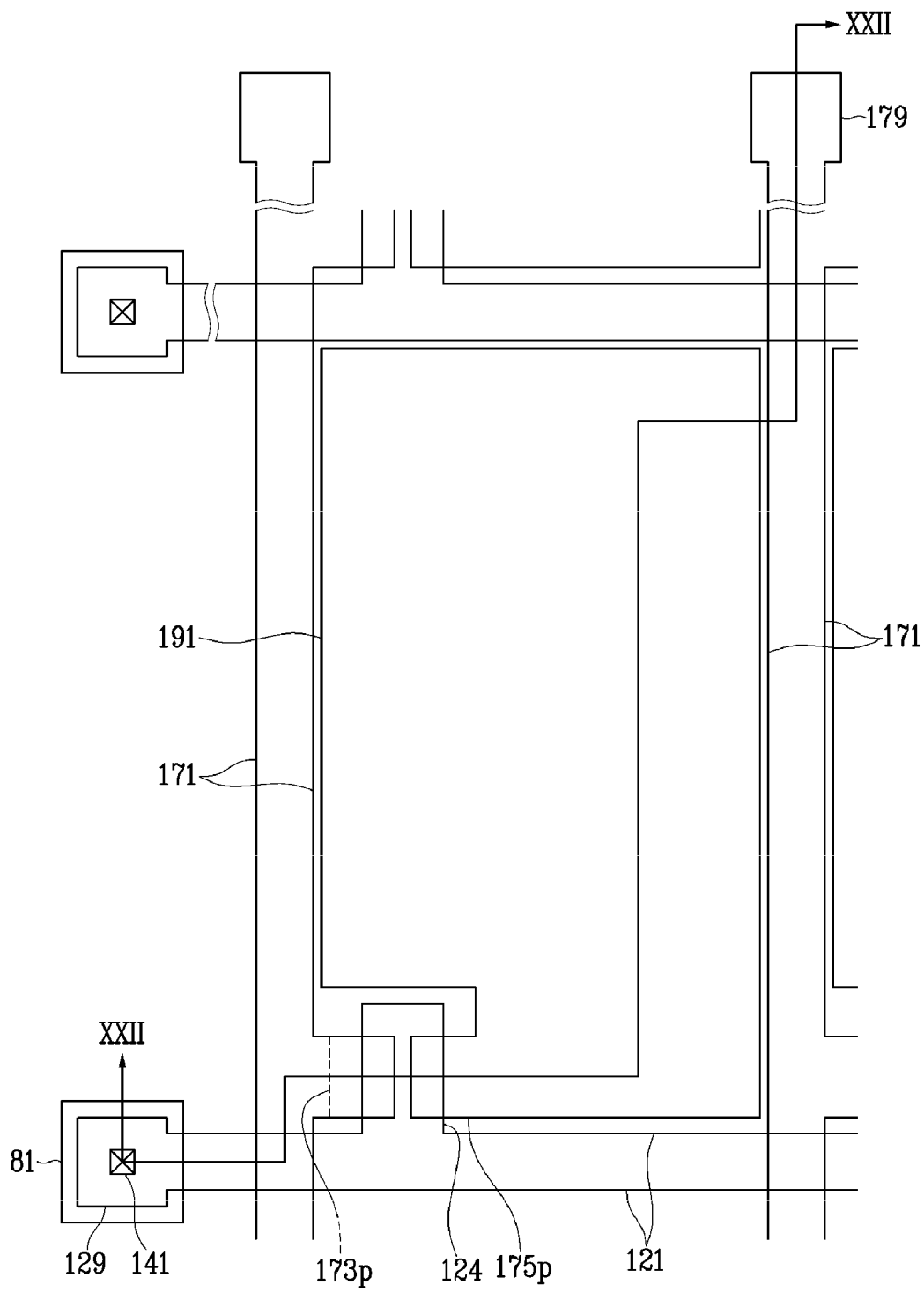
Figure 22:
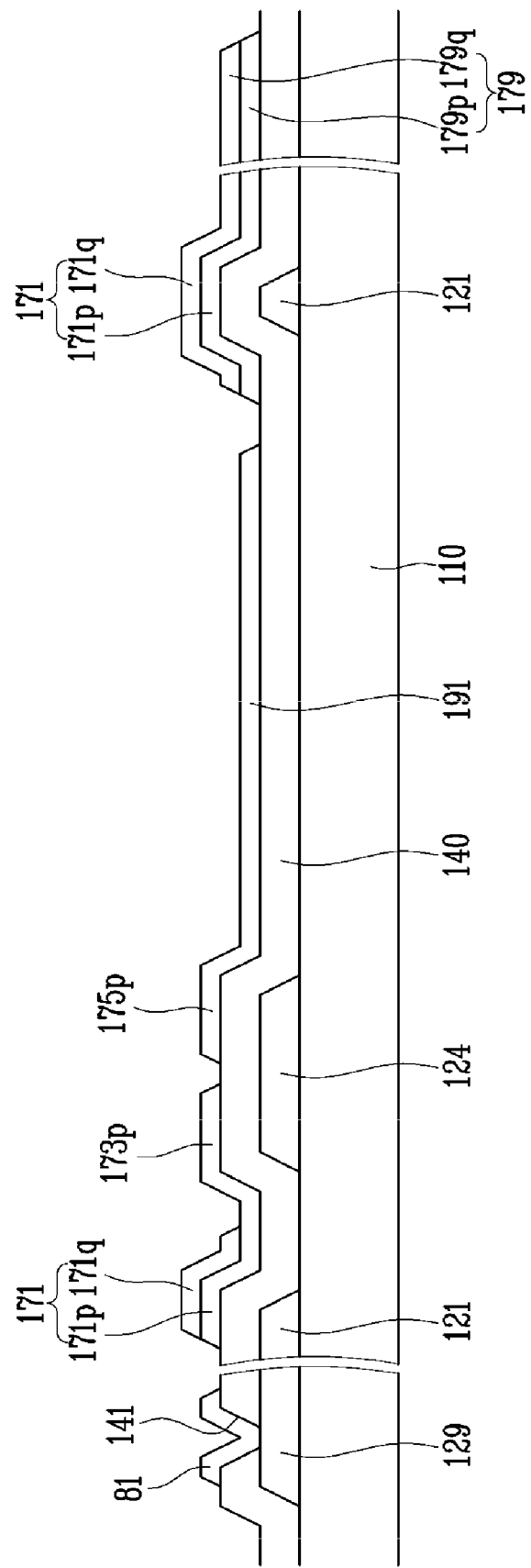
FIG. 22 is a sectional view of the OTFT array panel shown in FIG. 21 taken along the line XXII-XXII.
Figure 23:
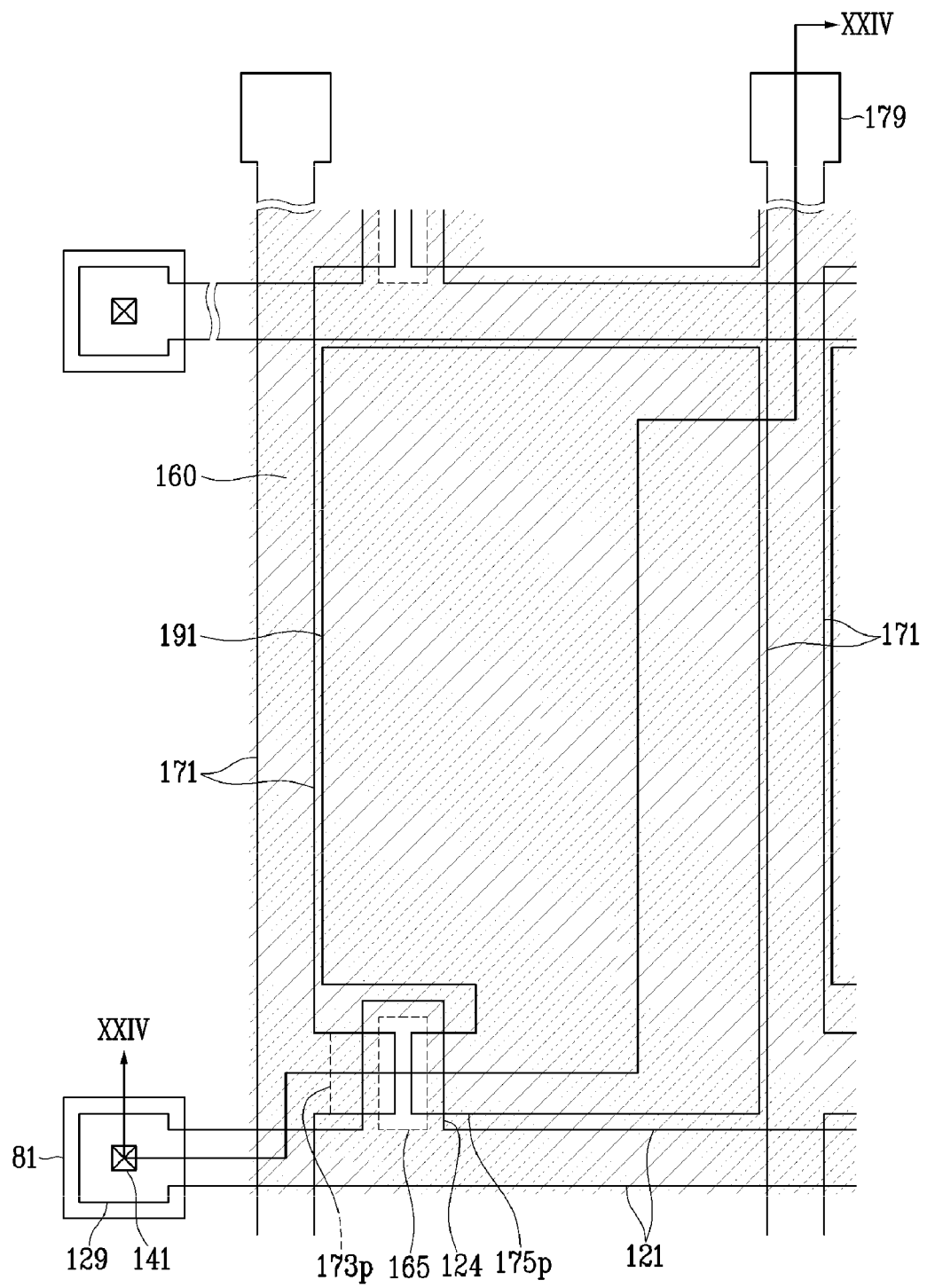
Figure 24:
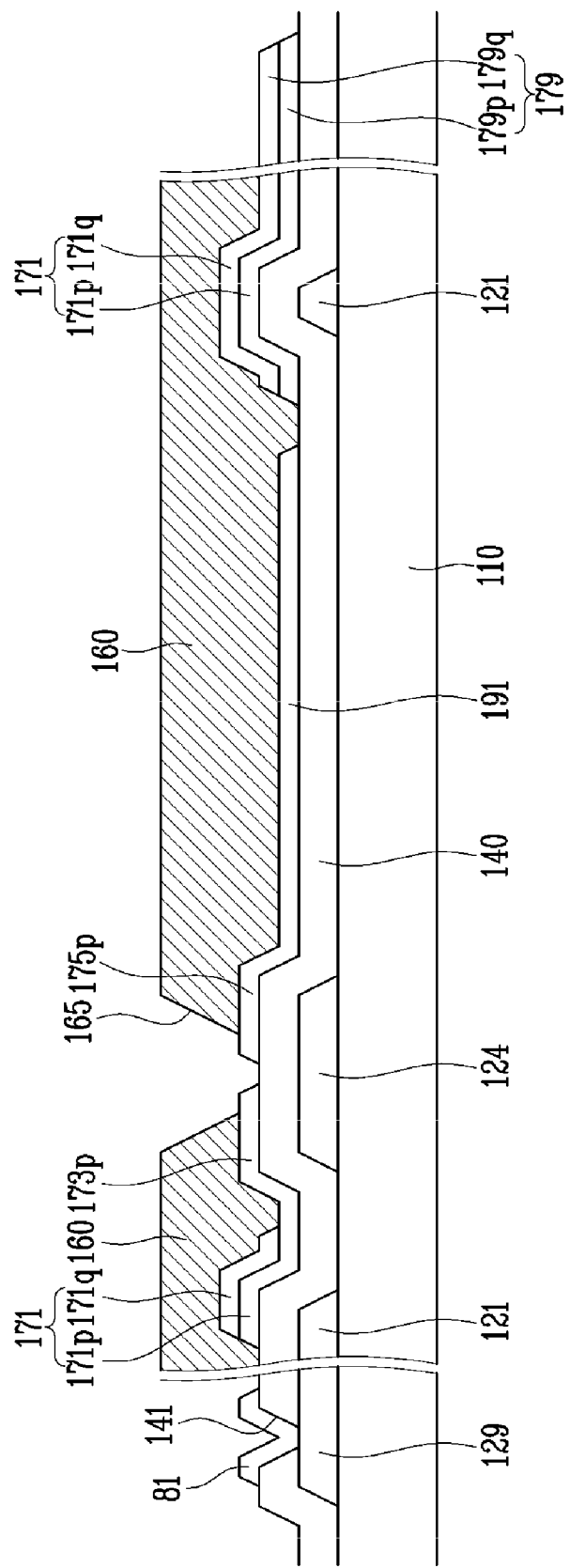
FIG. 24 is a sectional view of the OTFT array panel shown in FIG. 23 taken along the line XXIV-XXIV.
Figure 25:
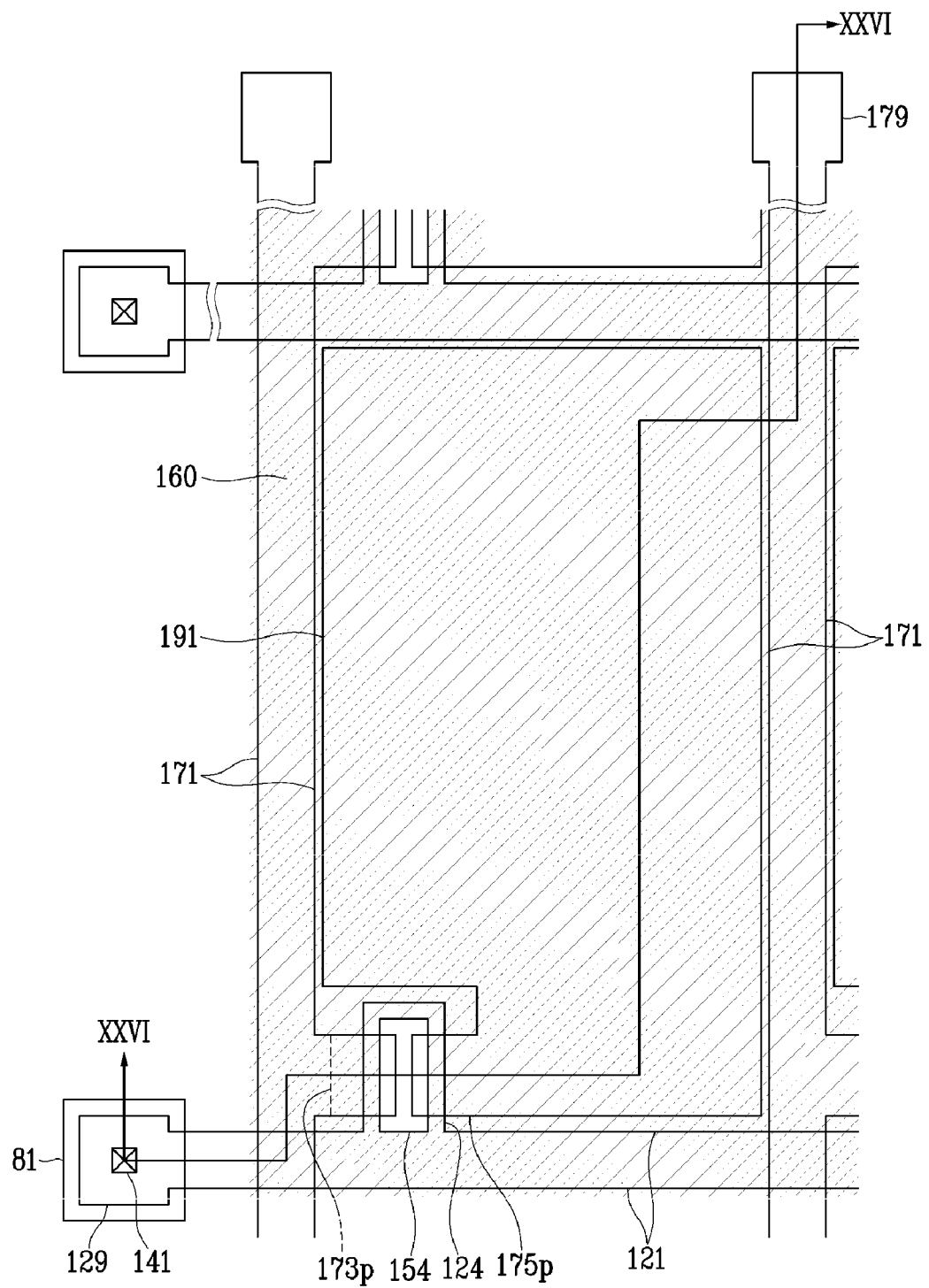
Figure 26:
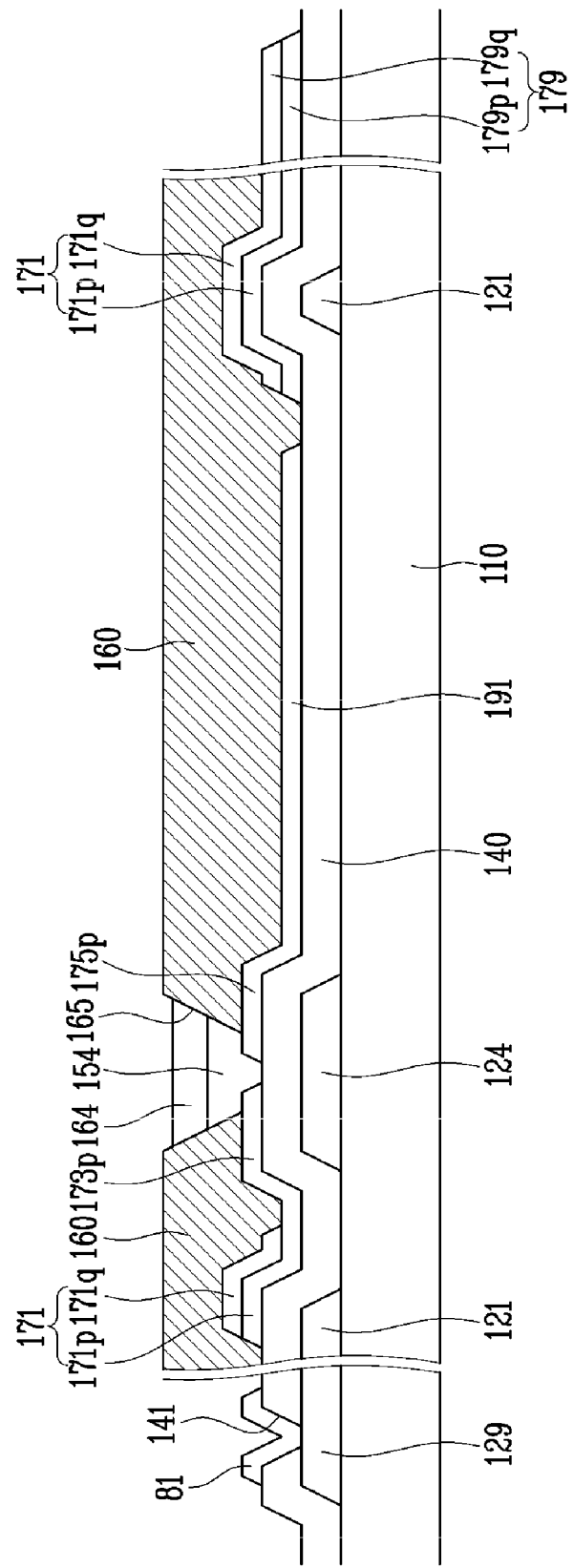
FIG. 26 is a sectional view of the OTFT array panel shown in FIG. 25 taken along the line XXVI-XXVI.
Figure 27:
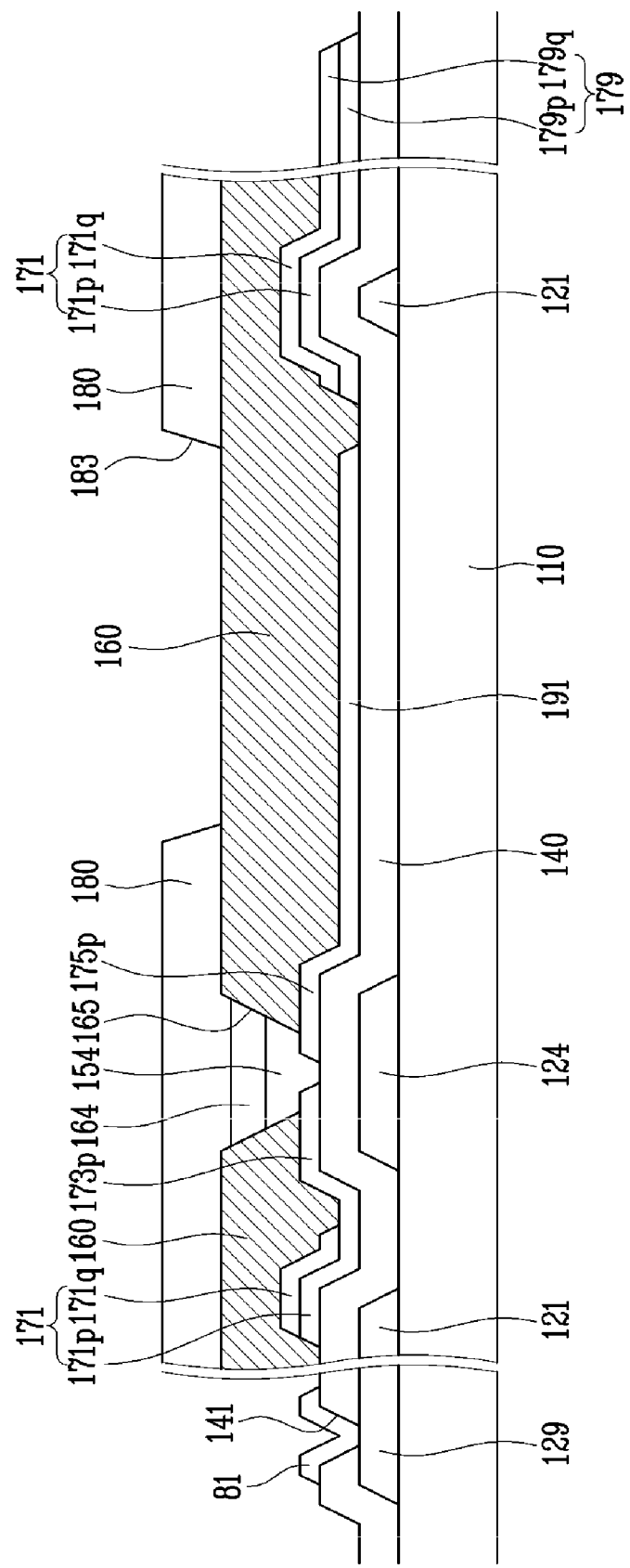
FIG. 27 is a sectional view showing the following steps of the OTFT array panel shown in FIGS. 25 and 26.

FIGS. 19, 21, 23, and 25 are layout views of the OTFT array panel shown in FIGS. 17 and 18 in intermediate steps of a manufacturing method thereof according to an embodiment of the present invention, FIG. 20 is a sectional view of the OTFT array panel shown in FIG. 19 taken along the line XX-XX, FIG. 22 is a sectional view of the OTFT array panel shown in FIG. 21 taken along the line XXII-XXII, FIG. 24 is a sectional view of the OTFT array panel shown in FIG. 23 taken along the line XXIV-XXIV, FIG. 26 is a sectional view of the OTFT array panel shown in FIG. 25 taken along the line XXVI-XXVI, and FIG. 27 is a sectional view showing the following steps of the OTFT array panel shown in FIGS. 25 and 26.

Referring to FIGS. 19 and 20, a conductive layer is deposited on a substrate 110 by using sputtering, etc., and is patterned by lithography to form a plurality of gate lines 121 including gate electrodes 124 and end portions 129.

Referring to FIGS. 21 and 22, a gate insulating layer 140 including a plurality of contact holes 141 is formed by deposition and patterning.

Next, a first layer made of ITO and a second layer including Mo are sequentially deposited on the substrate 110 by using sputtering, etc., and then a photoresist pattern having a position-dependent thickness is formed thereon as in the previous embodiment. Next, the first and second layers are patterned to form a plurality of data lines 171 and a plurality of pixel electrodes 191. Here, the pixel electrodes are formed with the same layer as the lower data lines 171, and portions of the pixel electrodes 191 form the drain electrodes 175p.

Subsequently, as shown in FIGS. 23 and 24, an organic photosensitive layer is coated on the substrate 110 and is developed to form an interlayer insulating layer 160 having a plurality of openings 165 exposing the portions of the source and the drain electrodes 173p and 175p.

As shown in FIGS. 25 and 26, a plurality of organic semiconductor islands 154 and a plurality of protecting members 164 are sequentially formed in the openings 165 by inkjet printing, etc. Because the interlayer insulating layer 160 covers the whole area except for the openings 165, the organic semiconductor solution is easily gathered or controlled. Also, any organic semiconductor solution that overflows out of the openings 165 and is deposited on misaligned positions by misalignment of the ink jet head does not flow into the pixel regions P and may be easily removed in the following processes.

Next, as shown in FIG. 27, a passivation layer 180 having a plurality of openings 183 is formed on the interlayer insulating layer 160 and the protecting members 164.

Finally, referring to FIGS. 17 and 18, the interlayer insulating layer 160 is etched using the passivation layer 180 as an etch mask to form a plurality of openings 163 exposing the pixel electrodes 191.

As above-described, the organic TFT array panel and the method for manufacturing the same according to this embodiment may have the same effects as that of the previous embodiments.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for manufacturing a thin film transistor array panel, comprising:
   forming a gate line and a pixel electrode on a substrate;
   forming a gate insulating layer on the gate line;
   forming a data line including a source electrode and a drain electrode on the gate insulating layer;
   forming an interlayer insulating layer covering the data line and the pixel electrode;
   forming a first opening in the interlayer insulating layer;

forming an organic semiconductor in the first opening;
forming a passivation layer on the organic semiconductor and the interlayer insulating layer; and
forming a second opening in the interlayer insulating layer to expose the pixel electrode after forming the passivation layer.

2. The method of claim 1 further comprising forming a protecting member on the organic semiconductor.

3. The method of claim 1, wherein the second opening is formed by etching the interlayer insulating layer using the passivation layer as an etch mask.

4. The method of claim 1, wherein the gate line and the pixel electrode are formed by depositing a first layer made of a transparent conductive material and a second layer made of a metallic material.

5. The method of claim 4, wherein forming the data line and the drain electrode includes:
sequentially depositing a third layer made of a transparent conductive material and a fourth layer made of a metallic material;
forming a photoresist pattern including a first portion and a second portion that is thinner than the first portion;
etching the fourth layer and the third layer using the photoresist pattern as an etch mask; and
etching the fourth layer using the first portion of the photoresist pattern as an etch mask.

6. The method of claim 5, wherein the second layer of the pixel electrode is etched when etching the fourth layer using the first portion of the photoresist pattern.

7. The method of claim 6, wherein the second portion of the photoresist pattern is aligned on the source electrode and the drain electrode.

8. The method of claim 1, wherein the organic semiconductor is formed by an ink-jet method.

9. A method for manufacturing a thin film transistor array panel, comprising:
forming a gate line including a gate electrode on a substrate;
forming a gate insulating layer covering the gate line;
forming a data line including a source electrode and a pixel electrode on the gate insulating layer;
forming an interlayer insulating layer covering the data line and the pixel electrode;
forming a first opening in the interlayer insulating layer;
forming an organic semiconductor in the first opening;
forming a passivation layer on the organic semiconductor and the interlayer insulating layer; and
forming a second opening in the interlayer insulating layer to expose the pixel electrode after forming the passivation layer.

10. The method of claim 1 further comprising forming a protecting member on the organic semiconductor.

11. The method of claim 10, wherein the second opening is formed by etching the interlayer insulating layer using the passivation layer as an etch mask.

12. The method of claim 10, wherein forming the data line and the pixel electrode includes:
sequentially depositing a first layer made of a transparent conductive material and a second layer made of a metal material; and
removing the portion of the second layer.

13. The method of claim 10, wherein the organic semiconductor is formed by an ink-jet method.

* * * * *